US012648232B2

(12) United States Patent
Do et al.

(10) Patent No.: US 12,648,232 B2
(45) Date of Patent: Jun. 2, 2026

(54) DEVICE FOR ELECTROSTATIC DISCHARGE PROTECTION USING SILICON CONTROLLED RECTIFIER

(71) Applicant: SAMSUNG ELECTRONICS CO., LTD., Suwon-si (KR)

(72) Inventors: Kyoungil Do, Suwon-si (KR); Jinwoo Jung, Suwon-si (KR); Jooyoung Song, Suwon-si (KR); Mijin Lee, Suwon-si (KR); Chanhee Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 18/402,387

(22) Filed: Jan. 2, 2024

(65) Prior Publication Data

US 2024/0222362 A1     Jul. 4, 2024

(30) Foreign Application Priority Data

Jan. 2, 2023     (KR) ........................ 10-2023-0000366

(51) Int. Cl.
*H10D 89/60*          (2025.01)
*H02H 9/04*           (2006.01)

(52) U.S. Cl.
CPC .......... *H10D 89/713* (2025.01); *H02H 9/046* (2013.01); *H10D 89/611* (2025.01); *H10D 89/921* (2025.01)

(58) Field of Classification Search
CPC .. H10D 89/713; H10D 89/611; H10D 89/921; H10D 18/251; H10D 89/911; H02H 9/046

USPC .......................................................... 361/56
See application file for complete search history.

(56) References Cited

U.S. PATENT DOCUMENTS

| | | | |
|---|---|---|---|
| 4,528,461 A * | 7/1985 | Shackle | H10D 18/251 |
| | | | 257/524 |
| 5,654,862 A | 8/1997 | Worley et al. | |
| 5,945,713 A | 8/1999 | Voldman | |
| 6,777,721 B1 | 8/2004 | Huang et al. | |
| 8,665,571 B2 * | 3/2014 | Salcedo | H02H 9/046 |
| | | | 361/118 |
| 9,245,878 B2 | 1/2016 | Song et al. | |

(Continued)

FOREIGN PATENT DOCUMENTS

| | | | | |
|---|---|---|---|---|
| CN | 112885816 A | 6/2021 | | |
| CN | 113540070 A | 10/2021 | | |
| WO | WO-2021213024 A1 * | 10/2021 | ........... | H10D 89/713 |

OTHER PUBLICATIONS

Ming-Dou Ker and K.-C. Hsu, "Overview of on-chip electrostatic discharge protection design with SCR-based devices in CMOS integrated circuits," in IEEE Transactions on Device and Materials Reliability, vol. 5, No. 2, pp. 235-249, Jun. 2005, doi: 10.1109/TDMR.2005.846824.

(Continued)

*Primary Examiner* — Dharti H Patel

(74) *Attorney, Agent, or Firm* — Sughrue Mion, PLLC

(57) ABSTRACT

A device, including a first silicon controlled rectifier comprising a first anode connected to a first node, a first cathode connected to a pad, and a first gate; a second silicon controlled rectifier comprising a second anode connected to the pad, a second cathode connected to a second node, and a second gate; and a back diode forwardly connected from the second node to the first gate.

20 Claims, 15 Drawing Sheets

(56)         References Cited

U.S. PATENT DOCUMENTS

| | | | |
|---|---|---|---|
| 11,699,697 B2 * | 7/2023 | Xu ....................... | H10D 89/811 |
| | | | 361/56 |
| 2009/0090972 A1 * | 4/2009 | Vinson ................. | H10D 89/711 |
| | | | 257/E23.002 |
| 2010/0103570 A1 | 4/2010 | Song et al. | |
| 2011/0019317 A1 * | 1/2011 | Vinson ................. | H10D 89/711 |
| | | | 361/18 |
| 2012/0176718 A1 * | 7/2012 | Jorgensen .............. | H02H 9/046 |
| | | | 361/111 |
| 2013/0314825 A1 | 11/2013 | Bajaj et al. | |
| 2014/0167104 A1 | 6/2014 | Salcedo | |
| 2014/0268451 A1 * | 9/2014 | Van Wijmeersch ... | H02H 9/046 |
| | | | 361/56 |
| 2021/0359511 A1 | 11/2021 | Xu | |
| 2023/0238454 A1 * | 7/2023 | Langguth ............. | H10D 62/126 |
| | | | 361/303 |
| 2024/0222357 A1 * | 7/2024 | Do ....................... | H10D 84/133 |
| 2024/0222362 A1 * | 7/2024 | Do ....................... | H10D 89/921 |

OTHER PUBLICATIONS

European Extended Search Report issued Jun. 25, 2024 by the European Patent Office for EP Patent Application No. 23220372.9.

* cited by examiner

DEVICE FOR ELECTROSTATIC DISCHARGE PROTECTION USING SILICON CONTROLLED RECTIFIER

CROSS-REFERENCE TO RELATED APPLICATION

This application is based on and claims priority under 35 U.S.C. § 119 to Korean Patent Application No. 10-2023-0000366, filed on Jan. 2, 2023, in the Korean Intellectual Property Office, the disclosure of which is incorporated by reference herein in its entirety.

BACKGROUND

1. Field

The disclosure relates to a device for electrostatic discharge (ESD) protection, and particularly, to a device for ESD protection using a silicon controlled rectifier.

2. Description of Related Art

ESD may cause an integrated circuit to malfunction or even damage the integrated circuit. Accordingly, the integrated circuit may include a component for ESD protection, which may protect an internal circuit from ESD generated outside the integrated circuit. Due to the development of semiconductor processes, the size of elements included in an integrated circuit may be reduced, the operating voltage of elements included in an integrated circuit may be reduced to reduce power consumption, and the frequency of signals input to or output from an integrated circuit may be increased to achieve high performance. Accordingly, there is a need for components for ESD protection to have improved performance.

SUMMARY

Provided is a device for providing electrostatic discharge (ESD) protection, the device using a silicon controlled rectifier to improve performance.

Additional aspects will be set forth in part in the description which follows and, in part, will be apparent from the description, or may be learned by practice of the presented embodiments.

In accordance with an aspect of the disclosure, a device includes a first silicon controlled rectifier comprising a first anode connected to a first node, a first cathode connected to a pad, and a first gate; a second silicon controlled rectifier comprising a second anode connected to the pad, a second cathode connected to a second node, and a second gate; and a back diode forwardly connected from the second node to the first gate.

In accordance with an aspect of the disclosure, a device includes a first silicon controlled rectifier comprising a first p-well and a first n-well consecutively disposed in a substrate, a first n+ region disposed in the first p-well, and a first p+ region disposed in the first n-well, wherein the first p+ region is electrically connected to a first node; a second silicon controlled rectifier comprising a second n-well and a second p-well consecutively disposed in the substrate, a second p+ region disposed in the second n-well, and a second n+ region disposed in the second p-well, wherein the second n+ region is electrically connected to a second node; and a back diode comprising a third n+ region disposed in the substrate between the first silicon controlled rectifier and the second silicon controlled rectifier, wherein the third n+ region is electrically connected to the first p-well, wherein the first n+ region and the second p+ region are electrically connected to a pad.

In accordance with an aspect of the disclosure, a device includes a first PNP bipolar transistor and a first NPN bipolar transistor, wherein a base of the first NPN bipolar transistor is connected to a collector of the first PNP bipolar transistor, and wherein a collector of the first NPN bipolar transistor is connected to a base of the first PNP bipolar transistor; and a second PNP bipolar transistor and a second NPN bipolar transistor, wherein a base of the second NPN bipolar transistor is connected to a collector of the second PNP bipolar transistor, and wherein a collector of the second NPN bipolar transistor is connected to a base of the second PNP bipolar transistor, wherein an emitter of the first PNP bipolar transistor is connected to a first node, wherein an emitter of the first NPN bipolar transistor and an emitter of the second PNP bipolar transistor are connected to a pad, wherein an emitter of the second NPN bipolar transistor is connected to a second node, and wherein the device further comprises a back diode forwardly connected from the second node to the base of the first NPN bipolar transistor.

BRIEF DESCRIPTION OF DRAWINGS

The above and other aspects, features, and advantages of certain embodiments of the present disclosure will be more apparent from the following detailed description taken in conjunction with the accompanying drawings, in which:

FIGS. 6A and 6B are diagrams showing examples of a layout of an IO clamp according to embodiments;

FIG. 12 is a diagram showing a layout of an IO clamp according to an embodiment;

FIG. 14 is a diagram showing a layout of an IO clamp according to an embodiment.

DETAILED DESCRIPTION OF EMBODIMENTS

Figure 1:
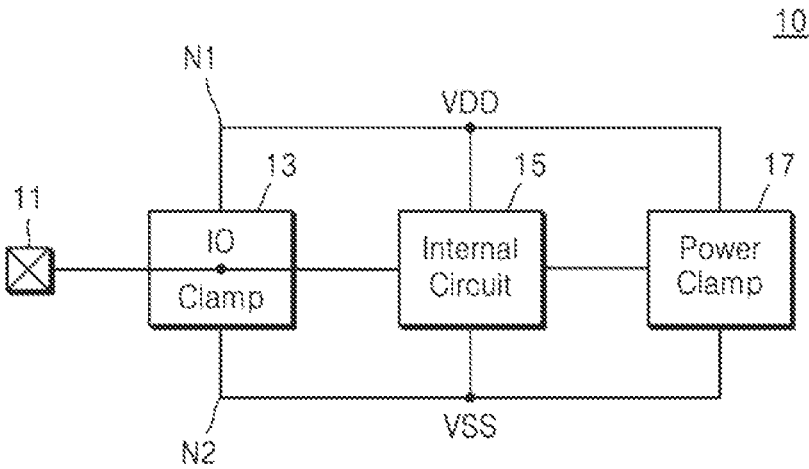
FIG. 1 is a block diagram of a device according to an embodiment.

Hereinafter, embodiments of the present disclosure will be described as follows with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram of a device 10 according to an embodiment. In some embodiments, the device 10 may include an integrated circuit manufactured by a semiconductor process. For example, the device 10 may be a chip or die, or may be a semiconductor package including at least one chip or die. As shown in FIG. 1, the device 10 may include an input/output (IO) pad 11, an IO clamp 13, an internal circuit 15, and a power clamp 17. As shown in FIG. 1, a positive supply voltage VDD may be applied to a first node N1, and a negative supply voltage VSS may be applied to a second node N2.

The IO pad 11 may be exposed to the outside of the device 10. For example, a signal received from the outside may be provided to the internal circuit 15 through the IO pad 11, and a signal generated in the internal circuit 15 may be output to the outside through the IO pad 11. As shown in FIG. 1, the IO pad 11 may be connected to the IO clamp 13, in addition to the internal circuit 15. Herein, when two or more components are referred to as connected, this may mean that the two or more components are electrically connected to each other. For example, when two components are referred to as being connected to each other through a resistor, the two components may be electrically connected to the resistor.

When electrostatic discharge (ESD) occurs in the IO pad 11, the IO clamp 13 may form a low-impedance discharge path between the IO pad 11 and the first node N1 or between the IO pad 11 and the second node N2. In addition, when ESD occurs between the first node N1 and the second node N2, the power clamp 17 may form a low-impedance discharge path between the first node N1 and the second node N2. Accordingly, the internal circuit 15 may be protected from ESD by the IO clamp 13 and the power clamp 17.

Due to the development of semiconductor processes, the size of elements included in the internal circuit 15 may be reduced, and a junction depth and the thickness of a gate oxide may be reduced. In addition, to achieve low power consumption and high operating speed, the operating voltage of the internal circuit 15, for example, the voltage difference between the positive supply voltage VDD and the negative supply voltage VSS may be reduced, and the frequency of signals input or output through the IO pad 11 may be increased. Therefore, there may be a need for the IO clamp 13 to meet more stringent operating parameters, for example, high current driving capability, low starting voltage, low leakage current, low capacitance, and the like.

In some embodiments, the IO clamp 13 may include a silicon controlled rectifier. The silicon controlled rectifier may have high current density based on double injection, and thus may provide high ESD performance per unit area, reduced area, and reduced capacitance. However, as described below with reference to FIG. 3, the silicon controlled rectifier as a snapback element may have a very high operation start voltage due to the high breakdown voltage between wells, and when ESD protection is implemented using only the silicon controlled rectifier, the internal circuit 15 having a low operating voltage may be damaged.

As described below, the IO clamp 13 may include a trigger circuit. The trigger circuit may allow the silicon controlled rectifier to be driven at a lower voltage, for example, a lower trigger voltage. In addition, the IO clamp 13 may include an element for preventing electrical characteristics of the silicon controlled rectifier from being changed due to an unnecessary current. Accordingly, the IO clamp 13 may have a low trigger voltage and low capacitance, in addition to high current driving capability.

Figure 2:
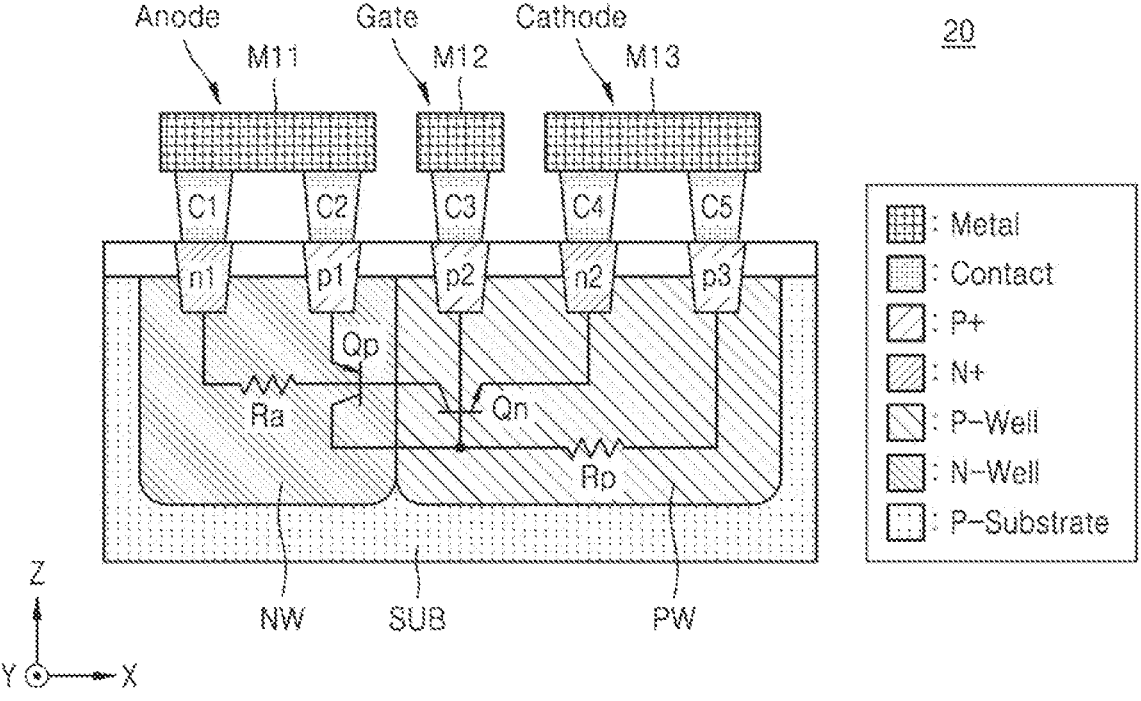
FIG. 2 is a cross-sectional view of a silicon controlled rectifier according to an embodiment.
Figure 3:
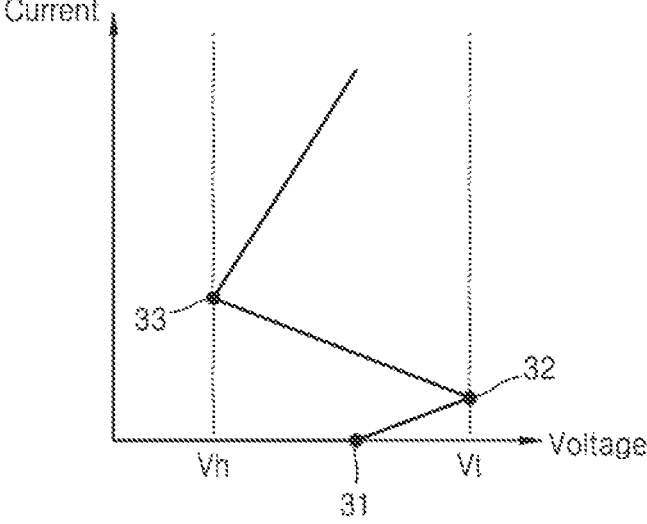
FIG. 3 is a graph showing characteristics of a silicon controlled rectifier according to an embodiment.

FIG. 2 is a cross-sectional view of a silicon controlled rectifier 20 according to an embodiment, and FIG. 3 is a graph showing characteristics of the silicon controlled rectifier 20 according to an embodiment. For example, the cross-sectional view of FIG. 2 shows a cross-section of the silicon controlled rectifier 20 taken along a plane including an X-axis and a Z-axis and an equivalent circuit of the silicon controlled rectifier 20, and the graph of FIG. 3 shows a snapback curve of the silicon controlled rectifier 20.

Herein, an X-axis direction may be referred to as a first horizontal direction, a Y-axis direction may be referred to as a second horizontal direction, and a Z-axis direction may be referred to as a vertical direction. A plane including the X-axis and the Y-axis may be referred to as a horizontal plane, a first component disposed in a +Z direction relative to a second component may be referred to as being above the second component, and a first component disposed in a −Z direction relative to a second component may be referred to as being below the second component. In addition, the area of a component may refer to the size occupied by the component in a plane parallel to the horizontal plane, and the width of a component may refer to the length of the component in a direction perpendicular to a direction in which the component extends. A surface exposed in the +Z direction may be referred to as a top surface, a surface exposed in the −Z direction may be referred to as a bottom surface, and a surface exposed in a +X direction or a +Y direction may be referred to as a side surface. A pattern including a conductive material may be referred to as a conductive pattern, and may also be referred to as a pattern.

Referring to FIG. 2, the silicon controlled rectifier 20 may include a PNP bipolar transistor Qp and an NPN bipolar transistor Qn, and bases and collectors of the PNP bipolar transistor Qp and the NPN bipolar transistor Qn may be cross-coupled to each other. An emitter of the PNP bipolar transistor Qp may be referred to as an anode of the silicon controlled rectifier 20, the collector of the PNP bipolar transistor Qp and the base of the NPN bipolar transistor Qn that are connected to each other may be referred to as a gate of the silicon controlled rectifier 20, and an emitter of the NPN bipolar transistor Qn may be referred to as a cathode of the silicon controlled rectifier 20.

The silicon controlled rectifier 20 may include a resistor Ra connected between the anode and the base of the PNP bipolar transistor Qp (or the collector of the NPN bipolar transistor Qn). In addition, the silicon controlled rectifier 20 may include a resistor Rp connected between the cathode and the base of the NPN bipolar transistor Qn (or the collector of the PNP bipolar transistor Qp). As shown in FIG. 2, the resistor Ra may include a resistor of an n-well NW, and the resistor Rp may include a resistor of a p-well PW. As described below, in some embodiments the resistor Ra and/or the resistor Rp may be omitted in the silicon controlled rectifier 20.

As shown in FIG. 2, the silicon controlled rectifier 20 may include wells and doped regions disposed in the wells. For example, the n-well NW and the p-well PW may be disposed in a p-type substrate SUB. In embodiments, an n-well may refer to an n-type well, and a p-well may refer to a p-type well. A first n+ region n1 and a first p+ region p1 may be disposed in the n-well NW. A second p+ region p2, a second n+ region n2, and a third p+ region p3 may be disposed in the p-well PW. Herein, an n+ region may have a higher n-type dopant concentration than an n-well, and a p+ region may have a higher p-type dopant concentration than a p-well. In addition, a deep n-well may have an n-type dopant concentration that is similar to or lower than that of the n-well and lower than that of the n+ region.

A first contact C1 may be disposed on the first n+ region n1, and a second contact C2 may be disposed on the first p+ region p1. The first contact C1 and the second contact C2 may be connected to each other through a first pattern M11. A third contact C3 may be disposed on the second p+ region p2, and the third contact C3 may be disposed in a second pattern M12. A fourth contact C4 may be disposed on the second n+ region n2, and a fifth contact C5 may be disposed on the third p+ region p3. The fourth contact C4 and the fifth contact C5 may be connected to each other through a third pattern M13. The first to third patterns M11 to M13 may be patterns disposed in a wiring layer, for example, patterns disposed in a metal layer.

The PNP bipolar transistor Qp may include the first p+ region p1 (which may correspond to the emitter), the n-well NW (which may correspond to the base), and the p-well PW (which may correspond to the collector). Further, the NPN bipolar transistor Qn may include the second n+ region n2 (which may correspond to the emitter), the p-well PW (which may correspond to the base), and the n-well NW (which may correspond to the collector). In addition, the resistor Ra may correspond to a resistor included in the n-well NW, and the resistor Rp may correspond to a resistor included in the p-well PW. In some embodiments, the first n+ region n1 and/or the third p+ region p3 may be omitted, and thus, the resistor Ra and/or the resistor Rp may be omitted. In some embodiments, a via may be disposed between a contact and a pattern.

Referring to FIG. 3, the silicon controlled rectifier 20 may have characteristics corresponding to a snapback curve. For example, as the voltage between the anode and the cathode increases, a breakdown may occur between the n-well NW and the p-well PW at a first point 31. At a second point 32, each of the PNP bipolar transistor Qp and the NPN bipolar transistor Qn may be turned on due to the voltage reaching a trigger voltage Vt, and thus, the voltage may decrease and the current may increase. At a third point 33, the voltage may reach a bipolar hold voltage Vh, and an ESD current may flow in a latch mode. Herein, the bipolar hold voltage Vh may be simply referred to as a hold voltage. The trigger voltage Vt may reach, for example, about 18 V to about 20 V due to the high breakdown voltage between the n-well NW and the p-well PW (e.g., the voltage at the first point 31), and may not be suitable for protecting elements of an internal circuit having a low operating voltage, for example, about 3 V or about 1.5 V. As described above with reference to FIG. 1, the IO clamp 13 of FIG. 1 may include a trigger circuit capable of lowering the trigger voltage Vt in the silicon controlled rectifier 20.

Figure 4:
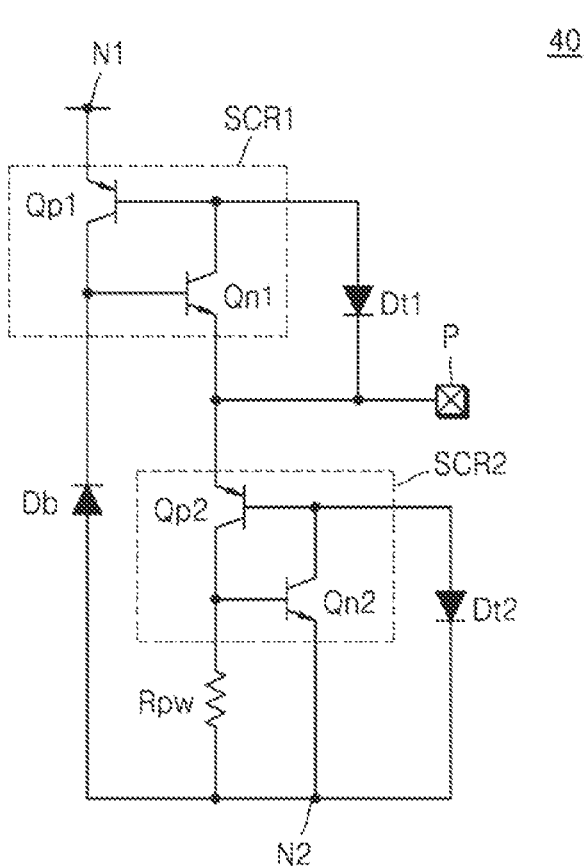
FIG. 4 is a circuit diagram of an input/output (IO) clamp according to an embodiment.

FIG. 4 is a circuit diagram of an TO clamp 40 according to an embodiment. For example, the circuit diagram of FIG. 4 shows the IO clamp 40 for providing ESD protection, wherein, when ESD occurs in a first node N1, a second node N2, or a pad P, the IO clamp 40 may form discharge paths between the first node N1 and the pad P and between the second node N2 and the pad P. As shown in FIG. 4, the IO clamp 40 may include a first silicon controlled rectifier SCR1, a second silicon controlled rectifier SCR2, a resistor Rpw, a first trigger diode Dt1, a second trigger diode Dt2, and a back diode Db. In some embodiments, the resistor Rpw may correspond to a well resistor, as described above with reference to FIG. 2.

The first silicon controlled rectifier SCR1 may include a first PNP bipolar transistor Qp1 and a first NPN bipolar transistor Qn1. The first silicon controlled rectifier SCR1 may have an anode connected to the first node N1, a cathode connected to the pad P. and a gate connected to the back diode Db. The second silicon controlled rectifier SCR2 may include a second PNP bipolar transistor Qp2 and a second NPN bipolar transistor Qn2. Herein, when the resistor Rpw is a well resistor, the resistor Rpw may be referred to as being included in the second silicon controlled rectifier SCR2. The second silicon controlled rectifier SCR2 may have an anode connected to the pad P, a cathode connected to the second node N2, and a gate connected to the resistor Rpw (or the second node N2).

The first trigger diode Dt1 may have an anode connected to a base of the first PNP bipolar transistor Qp1 (or a collector of the first NPN bipolar transistor Qn1) and a cathode connected to the pad P. For example, the first trigger diode Dt1 may be connected in a forward direction from the base of the first PNP bipolar transistor Qp1 to the pad P. In embodiments, a forward direction of a diode may refer to a direction from an anode to a cathode. Further, a diode connected in a forward direction from a first element to a second element may be referred to as being forwardly connected from the first element to the second element. Therefore, in embodiments, when a diode is forwardly connected from a first element to a second element, this may mean that an anode of the diode is connected to the first element, and that a cathode of the diode is connected to the second element. Accordingly, when a high voltage is generated between the first node N1 and the pad P due to ESD, a trigger current may flow through the first PNP bipolar transistor Qp1 and the first trigger diode Dt1, and a base current of the first PNP bipolar transistor Qp1 may be generated. Accordingly, the first silicon controlled rectifier SCR1 may be driven at a lower trigger voltage.

The second trigger diode Dt2 may have an anode connected to a base of the second PNP bipolar transistor Qp2 (or a collector of the second NPN bipolar transistor Qn2) and a cathode connected to the second node N2. For example, the second trigger diode Dt2 may be forwardly connected from the base of the second PNP bipolar transistor Qp2 to the second node N2. Accordingly, when a high voltage is generated between the pad P and the second node N2 due to ESD, a trigger current may flow through the second PNP bipolar transistor Qp2 and the second trigger diode Dt2, and a base current of the second PNP bipolar transistor Qp2 may be generated. Accordingly, the second silicon controlled rectifier SCR2 may be driven at a lower trigger voltage.

In some embodiments, the IO clamp 40 may further include at least one trigger diode connected in series to the first trigger diode Dt1, and thus, the trigger voltage of the first silicon controlled rectifier SCR1 may increase. In addition, in some embodiments, the IO clamp 40 may further include at least one trigger diode connected in series to the second trigger diode Dt2, and thus, the trigger voltage of the second silicon controlled rectifier SCR2 may increase. The IO clamp 40 may include an appropriate number of trigger diodes so that the first silicon controlled rectifier SCR1 and the second silicon controlled rectifier SCR2 may have a trigger voltage required according to the operating voltage, voltage margin, and the like of an internal circuit.

The back diode Db may have a cathode connected to the gate of the first silicon controlled rectifier SCR1 and an anode connected to the second node N2. For example, the back diode Db may be forwardly connected from the second node N2 to the gate of the first silicon controlled rectifier SCR1. When a high voltage is generated in the pad P, while a discharge path may be formed between the pad P and the second node N2 by the second silicon controlled rectifier SCR2, as described above, a high voltage may be generated in a reverse junction of the first NPN bipolar transistor Qn1, for example, an emitter and a base of the first NPN bipolar transistor Qn1. As shown in FIG. 4, the back diode Db may be connected to the base of the first NPN bipolar transistor Qn1, and thus, a change in electrical characteristics of the first NPN bipolar transistor Qn1 due to the high voltage generated in the pad P may be prevented. In some embodiments, for example as described below with reference to FIG. 6A, the anode of the back diode Db may correspond to a p-type substrate, and the cathode of the back diode Db may correspond to an n+ region disposed in the p-type substrate. In some embodiments, the back diode Db may be disposed between the first silicon controlled rectifier SCR1 and the second silicon controlled rectifier SCR2.

Figure 5:
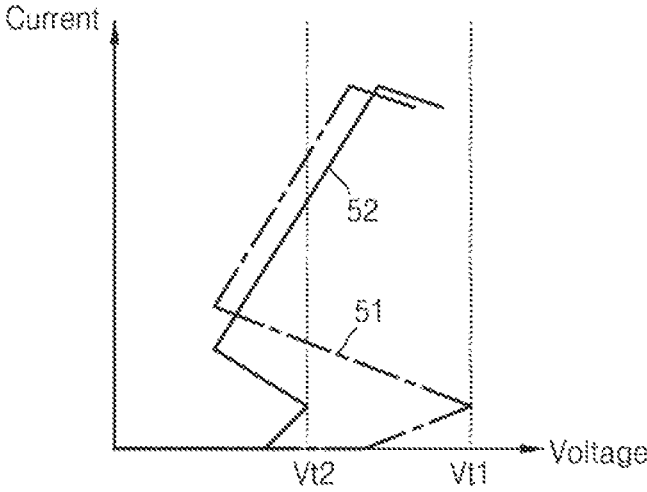
FIG. 5 is a graph showing characteristics of an IO clamp according to an embodiment.

FIG. 5 is a graph showing characteristics of an IO clamp according to an embodiment. For example, the graph of FIG. 5 shows a first snapback curve 51 corresponding to the silicon controlled rectifier 20 of FIG. 2, and a second snapback curve 52 corresponding to a combination of a silicon controlled rectifier and a trigger diode in the IO clamp 40 of FIG. 4. The second snapback curve 52 of FIG. 5 may correspond to the first silicon controlled rectifier SCR1 and the first trigger diode Dt1 between the first node N1 and the pad P. or may correspond to the second silicon controlled rectifier SCr2 and the second trigger diode Dt2 between the pad P and the second node N2. Referring to FIG. 5, the second snapback curve 52 may have a second trigger voltage Vt2 that is lower than a first trigger voltage Vt1 of the first snapback curve 51.

Figure 6A:
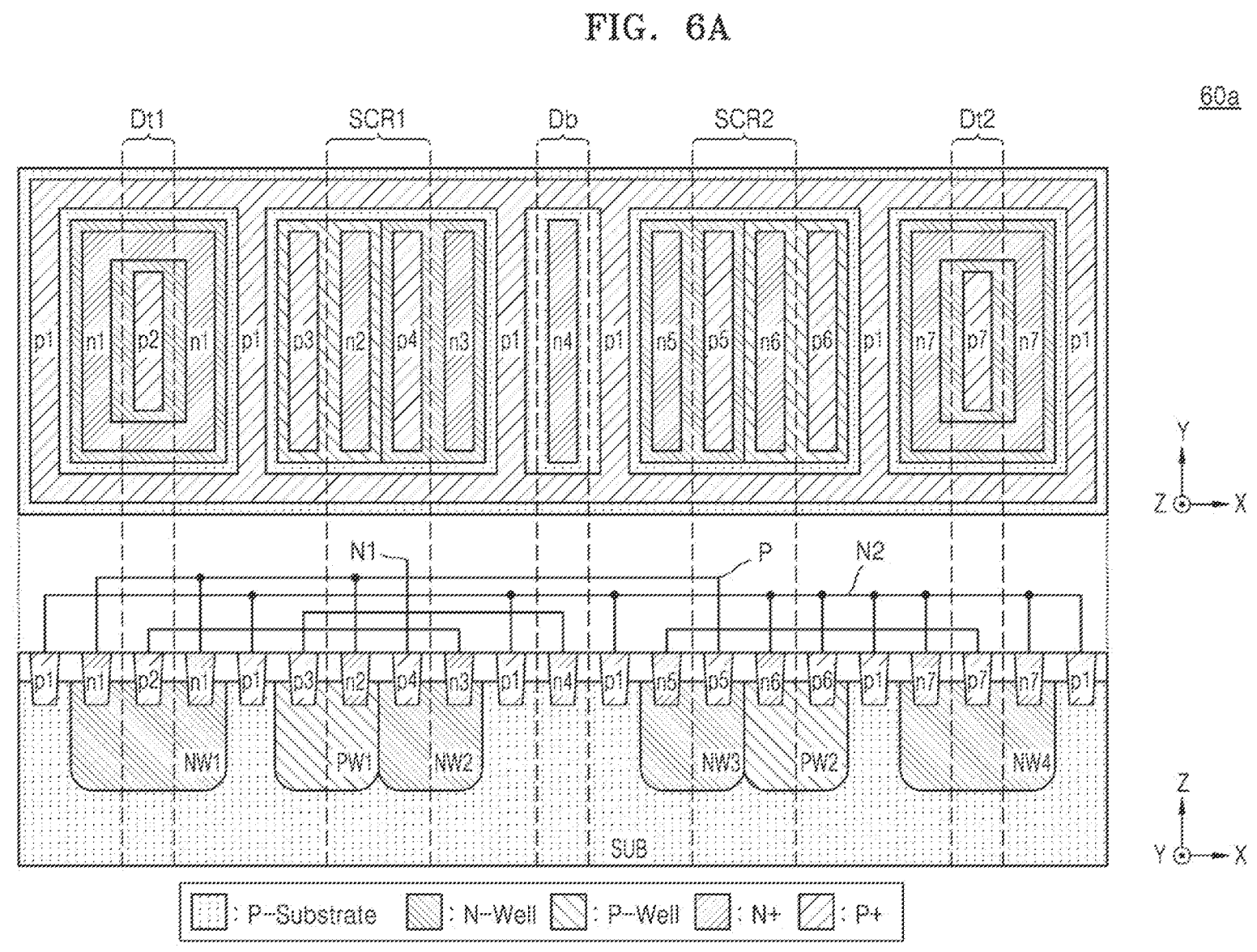
Figure 6B:
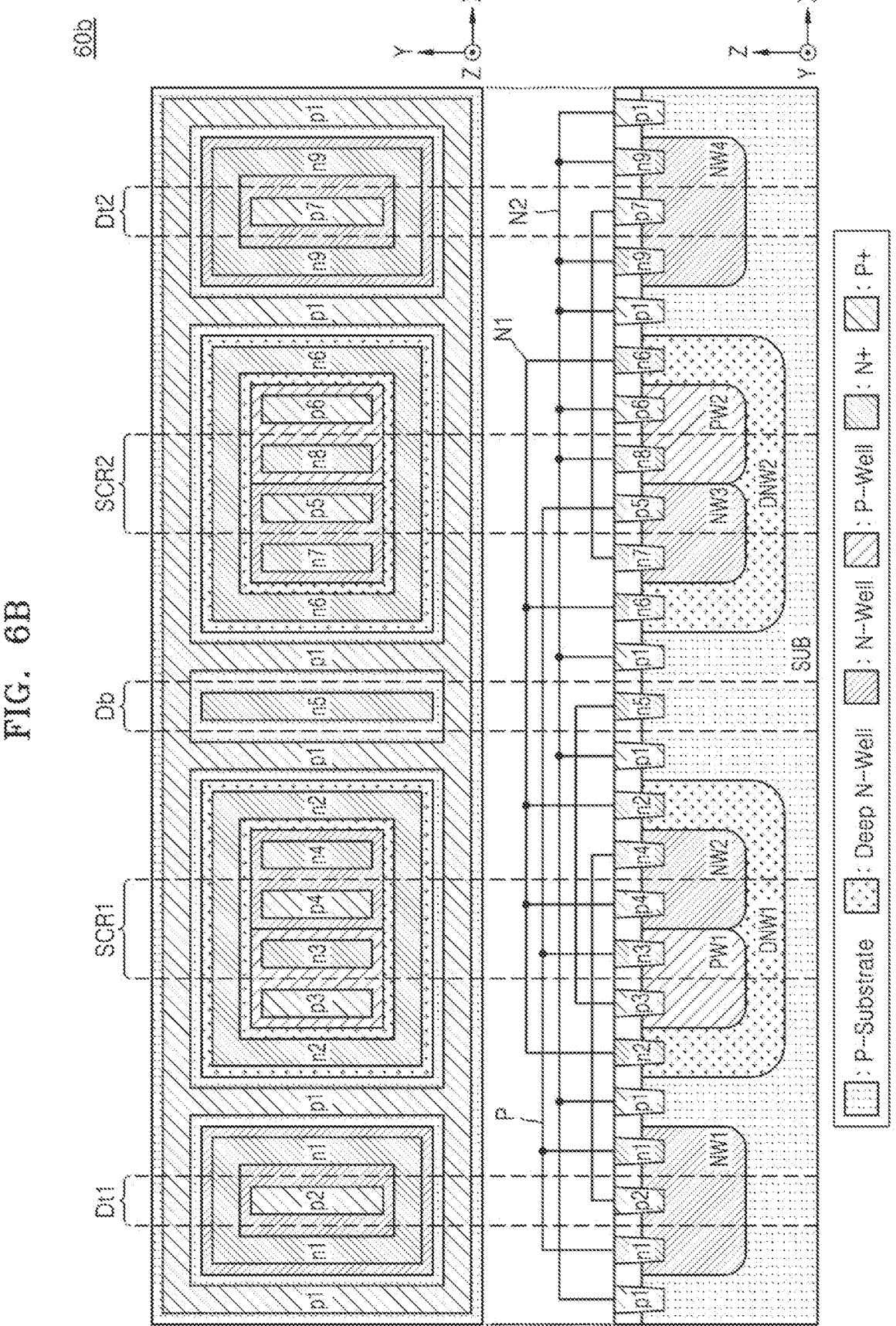

FIGS. 6A and 6B are diagrams showing examples of a layout of an IO clamp according to embodiments. For example, each of FIGS. 6A and 6B shows a plan view and a cross-sectional view of a layout corresponding to the IO clamp 40 of FIG. 4. In FIGS. 6A and 6B, contacts and patterns for connecting p+ regions, n+ regions, and gates to each other are omitted for convenience of illustration. It should be noted that the IO clamp 40 of FIG. 4 is not limited to layouts 60a and 60b of FIGS. 6A and 6B. Hereinafter, FIGS. 6A and 6B will be described with reference to FIG. 4.

Referring to FIG. 6A, first to fourth n-wells NW1 to NW4, a first p-well PW1, and a second p-well PW2 may be disposed in a substrate SUB including p-type impurities. A first p+ region p1 may surround each of the first silicon controlled rectifier SCR1, the second silicon controlled rectifier SCR2, the first trigger diode Dt1, the second trigger diode Dt2, and the back diode Db on the substrate SUB. As shown in FIG. 6A, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first trigger diode Dt1 on the first n-well NW1. As shown in FIG. 6A, the first n+ region n1 may be connected to the pad P. The second p+ region p2 and the first n-well NW1 may be included in the first trigger diode Dt1. As shown in FIG. 6A, the second p+ region p2 may be connected to the second n-well NW2 through a third n+ region n3, and thus may be connected to the base of the first PNP bipolar transistor Qp1 of the first silicon controlled rectifier SCR1.

In the substrate SUB, the first p-well PW1 and the second n-well NW2 may be consecutively disposed, and may abut each other. A third p+ region p3 and a second n+ region n2 may be disposed in the first p-well PW1, and a fourth p+ region p4 and the third n+ region n3 may be disposed in the second n-well NW2. As shown in FIG. 6A, the third p+ region p3 may be connected to a fourth n+ region n4, and thus may be connected to the back diode Db. The second n+ region n2, the fourth p+ region p4, the first p-well PW1 and the second n-well NW2 may be included in the first silicon controlled rectifier SCR1. As shown in FIG. 6A, the second n+ region n2, which may be the cathode of the first silicon controlled rectifier SCR1, may be connected to the pad P, and the fourth p+ region p4, which may be the anode of the first silicon controlled rectifier SCR1, may be connected to the first node N1. As described above, the third n+ region n3 may be connected to the first trigger diode Dt1.

The fourth n+ region n4 may be disposed between the first silicon controlled rectifier SCR1 and the second silicon controlled rectifier SCR2 in the substrate SUB. The fourth n+ region n4 and the substrate SUB, which includes a p-type dopant, may be included in the back diode Db. As shown in FIG. 6A, the fourth n+ region n4 may be connected to the first p-well PW1 through the third p+ region p3, and thus may be connected to the base of the first NPN bipolar transistor Qn1 of the first silicon controlled rectifier SCR1. In some embodiments, an additional n-well may be formed between the second n-well NW2 and the third n-well NW3, and the back diode Db may include the additional n-well and a p+ region disposed on the additional n-well.

In the substrate SUB, the third n-well NW3 and the second p-well PW2 may be consecutively disposed, and may abut each other. A fifth n+ region n5 and a fifth p+ region p5 may be disposed in the third n-well NW3, and a sixth n+ region n6 and a sixth p+ region p6 may be disposed in the second p-well PW2. As shown in FIG. 6A, the fifth n+ region n5 may be connected to a seventh p+ region p7, and thus may be connected to the second trigger diode Dt2. The fifth p+ region p5, the sixth n+ region n6, the third n-well NW3 and the second p-well PW2 may be included in the second silicon controlled rectifier SCR2. As shown in FIG. 6A, the fifth p+ region p5, which may be the anode of the second silicon controlled rectifier SCR2, may be connected to the pad P, and the sixth n+ region n6, which may be the cathode of the second silicon controlled rectifier SCR2, may be connected to the second node N2. The sixth p+ region p6 may be connected to the second node N2, and thus, a base of the second NPN bipolar transistor Qn2 (or a collector of the second PNP bipolar transistor Qp2) of the second silicon controlled rectifier SCR2 may be connected to the second node N2 through a resistor of the second p-well PW2, which may be the resistor Rpw.

A seventh n+ region n7 and the seventh p+ region p7 may be disposed in the fourth n-well NW4. The seventh n+ region n7 may surround the second trigger diode Dt2 on the fourth n-well NW4. As shown in FIG. 6A, the seventh n+ region n7 may be connected to the second node N2. The seventh p+ region p7 and the fourth n-well NW4 may be included in the second trigger diode Dt2. As shown in FIG. 6A, the seventh p+ region p7 may be connected to the third n-well NW3 through the fifth n+ region n5, and thus may be connected to the base of the second PNP bipolar transistor Qp2 of the second silicon controlled rectifier SCR2.

Referring to FIG. 6B, compared to the layout 60a of FIG. 6A, the layout 60b may further include at least one deep n-well, and a silicon controlled rectifier may be disposed in one of the deep n-wells. Accordingly, a p-well of the silicon controlled rectifier may be isolated from the substrate SUB by a deep n-well. As shown in FIG. 6B, a first n-well NW1, a first deep n-well DNW1, a second deep n-well DNW2, and a fourth n-well NW4 may be disposed in a substrate SUB including p-type impurities. A first p+ region p1 may surround each of the first deep n-well DNW1, the second deep n-well DNW2, the first trigger diode Dt1, the second trigger diode Dt2, and the back diode Db on the substrate SUB. As shown in FIG. 6B, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first trigger diode Dt1 on the first n-well NW1. As shown in FIG. 6B, the first n+ region n1 may be connected to the pad P. The second p+ region p2 and the first n-well NW1 may be included in the first trigger diode Dt1. As shown in FIG. 6B, the second p+ region p2 may be connected to a second n-well NW2 through a fourth n+ region n4, and thus may be connected to the base of the first PNP bipolar transistor Qp1 of the first silicon controlled rectifier SCR1.

A second n+ region n2 may surround the first silicon controlled rectifier SCR1 on the first deep n-well DNW1. As shown in FIG. 6B, the second n+ region n2 may be connected to the first node N1, and thus, a positive supply voltage (e.g., VDD in FIG. 1) may be applied to the first deep n-well DNW1. In the first deep n-well DNW1, a first p-well PW1 and the second n-well NW2 may be consecutively disposed, and may abut each other. A third p+ region p3 and a third n+ region n3 may be disposed in the first p-well PW1, and a fourth p+ region p4 and the fourth n+ region n4 may be disposed in the second n-well NW2. As shown in FIG. 6B, the third p+ region p3 may be connected to a fifth n+ region n5, and thus may be connected to the back diode Db. The third n+ region n3, the fourth p+ region p4, the first p-well PW1 and the second n-well NW2 may be included in the first silicon controlled rectifier SCR1. As shown in FIG. 6B, the third n+ region n3, which may be the cathode of the first silicon controlled rectifier SCR1 may be connected to the pad P, and the fourth p+ region p4, which may be the anode of the first silicon controlled rectifier SCR1, may be connected to the first node N1. As described above, the fourth n+ region n4 may be connected to the first trigger diode Dt1.

The fifth n+ region n5 may be disposed between the first silicon controlled rectifier SCR1 and the second silicon controlled rectifier SCR2 in the substrate SUB. The fifth n+ region n5 and the substrate SUB, which includes a p-type dopant, may be included in the back diode Db. As shown in FIG. 6B, the fifth n+ region n5 may be connected to the first p-well PW1 through the third p+ region p3, and thus may be connected to the base of the first NPN bipolar transistor Qn1 of the first silicon controlled rectifier SCR1. In some embodiments, an additional n-well may be formed between the second n-well NW2 and a third n-well NW3, and the back diode Db may include the additional n-well and a p+ region disposed on the additional n-well.

A sixth n+ region n6 may surround the second silicon controlled rectifier SCR2 on the second deep n-well DNW2. As shown in FIG. 6B, the sixth n+ region n6 may be connected to the first node N1, and thus, a positive supply voltage (e.g., VDD in FIG. 1) may be applied to the second deep n-well DNW2.

In the second deep n-well DNW2, the third n-well NW3 and a second p-well PW2 may be consecutively disposed, and may abut each other. A seventh n+ region n7 and a fifth p+ region p5 may be disposed in the third n-well NW3, and an eighth n+ region n8 and a sixth p+ region p6 may be disposed in the second p-well PW2. As shown in FIG. 6B, the seventh n+ region n7 may be connected to a seventh p+ region p7, and thus may be connected to the second trigger diode Dt2. The fifth p+ region p5, the eighth n+ region n8, the third n-well NW3 and the second p-well PW2 may be included in the second silicon controlled rectifier SCR2. As shown in FIG. 6B, the fifth p+ region p5, which may be the anode of the second silicon controlled rectifier SCR2, may be connected to the pad P, and the eighth n+ region n8, which may be the cathode of the second silicon controlled rectifier SCR2, may be connected to the second node N2. The sixth p+ region p6 may be connected to the second node N2, and thus, a base of the second NPN bipolar transistor Qn2 (or a collector of the second PNP bipolar transistor Qp2) of the second silicon controlled rectifier SCR2 may be connected to the second node N2 through a resistor of the second p-well PW2, which may be the resistor Rpw.

A ninth n+ region n9 and the seventh p+ region p7 may be disposed in the fourth n-well NW4. The ninth n+ region n9 may surround the second trigger diode Dt2 on the n-well NW4. As shown in FIG. 6B, the ninth n+ region n9 may be connected to the second node N2. The seventh p+ region p7 and the fourth n-well NW4 may be included in the second trigger diode Dt2. As shown in FIG. 6B, the seventh p+ region p7 may be connected to the third n-well NW3 through the seventh n+ region n7, and thus may be connected to the base of the second PNP bipolar transistor Qp2 of the second silicon controlled rectifier SCR2. Hereinafter, a structure in which a deep n-well is omitted, like the layout 60a of FIG. 6A, will be described with reference to the drawings. However, it will be understood that embodiments may include a deep n-well, like the layout 60b of FIG. 6B.

Figure 7:
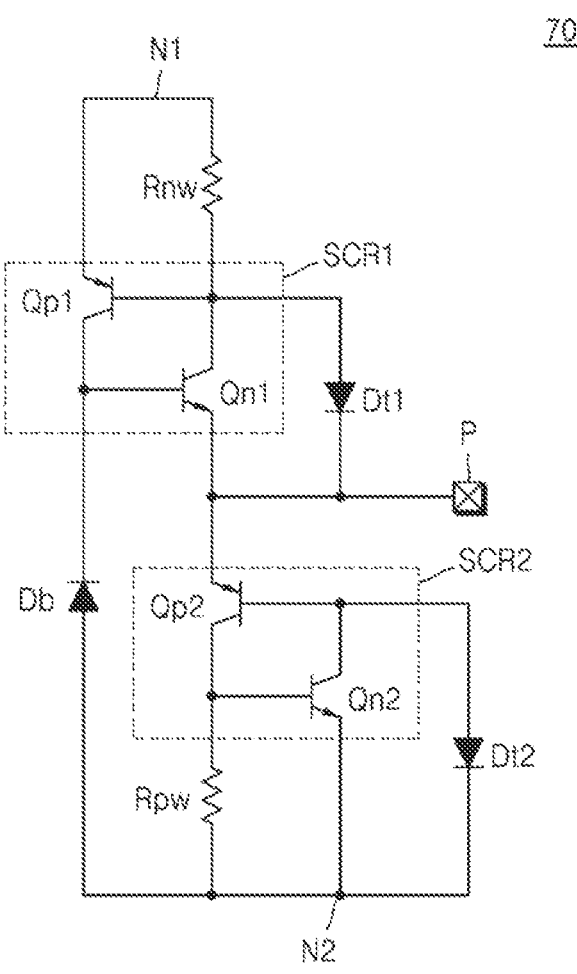
FIG. 7 is a circuit diagram of an IO clamp according to an embodiment.

FIG. 7 is a circuit diagram of an IO clamp 70 according to an embodiment. For example, the circuit diagram of FIG. 7 shows the IO clamp 70 for providing ESD protection, wherein, when ESD occurs in a first node N1, a second node N2, or a pad P, the IO clamp 70 may form discharge paths between the first node N1 and the pad P and between the second node N2 and the pad P. As shown in FIG. 7, the IO clamp 70 may include a first silicon controlled rectifier SCR1, a second silicon controlled rectifier SCR2, a first resistor Rnw, a second resistor Rpw, a first trigger diode Dt1, a second trigger diode Dt2, and a back diode Db. Compared to the IO clamp 40 of FIG. 4, the IO clamp 70 of FIG. 7 may further include the first resistor Rnw. In some embodiments, each of the first resistor Rnw and the second resistor Rpw may include a well resistor, as described above with reference to FIG. 2. Hereinafter, descriptions of FIG. 7 which are redundant or duplicative of descriptions provided above may be omitted.

The first silicon controlled rectifier SCR1 may include a first PNP bipolar transistor Qp1 and a first NPN bipolar transistor Qn1. Herein, when the first resistor Rnw is a well resistor, the first resistor Rnw may be referred to as being included in the first silicon controlled rectifier SCR1. The first silicon controlled rectifier SCR1 may have an anode connected to the first node N1, a cathode connected to the pad P, and a gate connected to the back diode Db. The second silicon controlled rectifier SCR2 may include a second PNP bipolar transistor Qp2 and a second NPN bipolar transistor Qn2. The second silicon controlled rectifier SCR2 may have an anode connected to the pad P, a cathode connected to second node N2, and a gate connected to the second resistor Rpw (or the second node N2).

The first trigger diode Dt1 may be forwardly connected from a base of the first PNP bipolar transistor Qp1 to the pad P. The second trigger diode Dt2 may be forwardly connected from a base of the second PNP bipolar transistor Qp2 to the second node N2. In some embodiments, the IO clamp 70 may further include at least one trigger diode connected in series to the first trigger diode Dt1, and may further include at least one trigger diode connected in series to the second trigger diode Dt2. The back diode Db may be forwardly connected from the second node N2 to the gate of the first silicon controlled rectifier SCR1.

Figure 8:
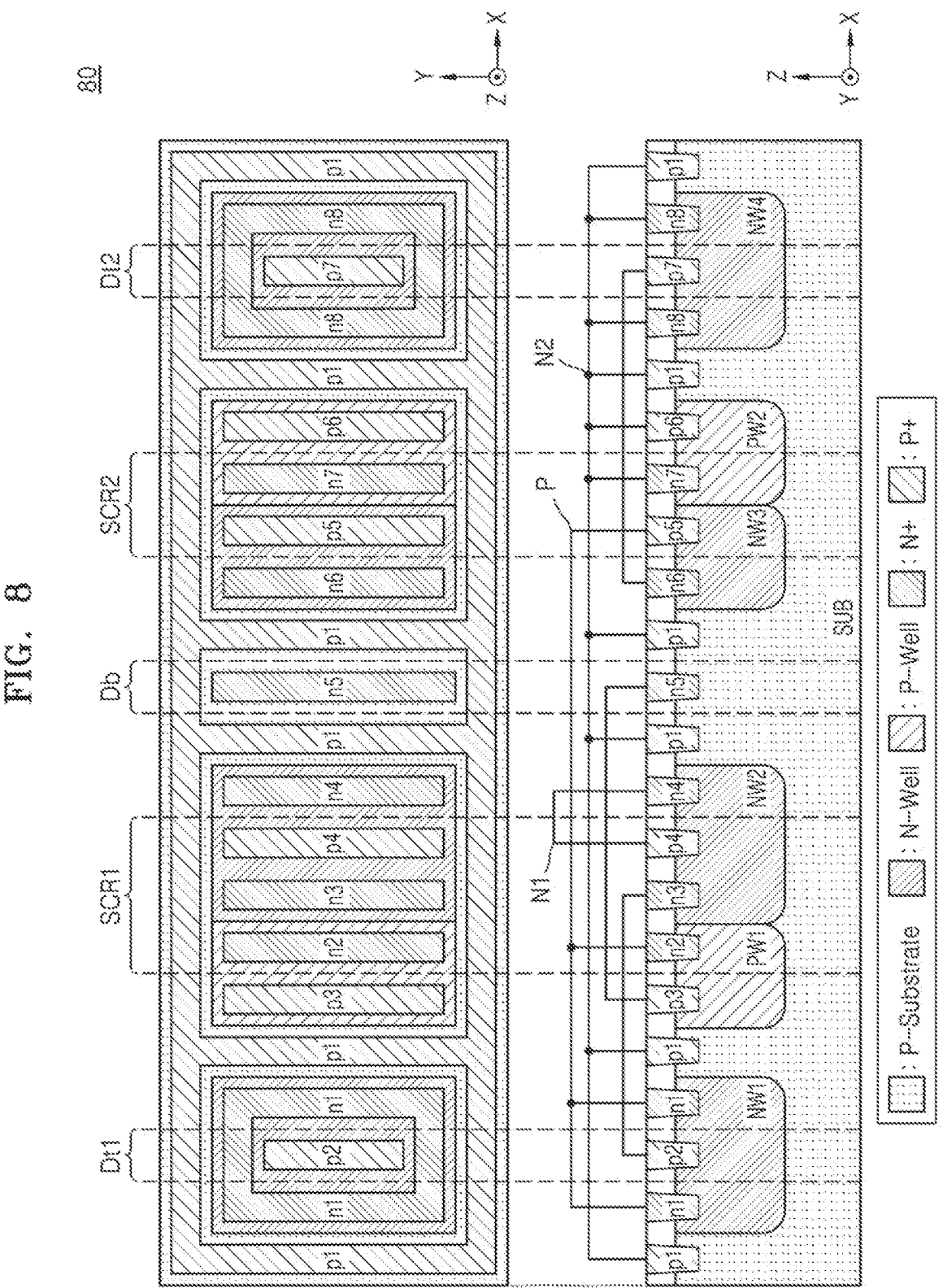
FIG. 8 is a diagram showing a layout of an IO clamp according to an embodiment.

FIG. 8 is a diagram showing a layout 80 of an IO clamp according to an embodiment. For example, FIG. 8 shows a plan view and a cross-sectional view of the layout 80 corresponding to the IO clamp 70 of FIG. 7. In FIG. 8, contacts and patterns for connecting p+ regions, n+ regions, and gates to each other are omitted for convenience of illustration. It should be noted that the IO clamp 70 of FIG. 7 is not limited to the layout 80 of FIG. 8. Hereinafter, FIG. 8 will be described with reference to FIG. 7.

Referring to FIG. 8, first to fourth n-wells NW1 to NW4, a first p-well PW1, and a second p-well PW2 may be disposed in a substrate SUB including p-type impurities. A first p+ region p1 may surround each of the first silicon controlled rectifier SCR1, the second silicon controlled rectifier SCR2, the first trigger diode Dt1, the second trigger diode Dt2, and the back diode Db on the substrate SUB. As shown in FIG. 8, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first trigger diode Dt1 on the first n-well NW1. As shown in FIG. 8, the first n+ region n1 may be connected to the pad P. The second p+ region p2 and the first n-well NW1 may be included in the first trigger diode Dt1. As shown in FIG. 8, the second p+ region p2 may be connected to the second n-well NW2 through a third n+ region n3, and thus may be connected to the base of the first PNP bipolar transistor Qp1 of the first silicon controlled rectifier SCR1.

In the substrate SUB, the first p-well PW1 and the second n-well NW2 may be consecutively disposed, and may abut each other. A third p+ region p3 and a second n+ region n2 may be disposed in the first p-well PW1, and a fourth p+ region p4, a third n+ region n3, and a fourth n+ region n4 may be disposed in the second n-well NW2. As shown in FIG. 8, the third p+ region p3 may be connected to a fifth n+ region n5, and thus may be connected to the back diode Db. The second n+ region n2, the third n+ region n3, the fourth p+ region p4, the first p-well PW1 and the second n-well NW2 may be included in the first silicon controlled rectifier SCR1. As shown in FIG. 8, the second n+ region n2, which may be the cathode of the first silicon controlled rectifier SCR1, may be connected to the pad P, and the fourth p+ region p4, which may be the anode of the first silicon controlled rectifier SCR1, may be connected to the first node N1. As described above, the third n+ region n3 may be connected to the first trigger diode Dt1. The fourth n+ region n4 may be connected to the first node N1, and thus, a collector of the first NPN bipolar transistor Qn1 (or the base of the first PNP bipolar transistor Qp1) of the first silicon controlled rectifier SCR1 may be connected to the first node N1 through a resistor of the second n-well NW2, which may be the first resistor Rnw.

The fifth n+ region n5 may be disposed between the first silicon controlled rectifier SCR1 and the second silicon controlled rectifier SCR2 in the substrate SUB. The fifth n+ region n5 and the substrate SUB, which includes a p-type dopant, may be included in the back diode Db. As shown in FIG. 8, the fifth n+ region n5 may be connected to the first p-well PW1 through the third p+ region p3, and thus may be connected to a base of the first NPN bipolar transistor Qn1 of the first silicon controlled rectifier SCR1. In some embodiments, an additional n-well may be formed between the second n-well NW2 and the third n-well NW3, and the back diode Db may include the additional n-well and a p+ region disposed on the additional n-well.

In the substrate SUB, the third n-well NW3 and the second p-well PW2 may be consecutively disposed, and may abut each other. A sixth n+ region n6 and a fifth p+ region p5 may be disposed in the third n-well NW3, and a seventh n+ region n7 and a sixth p+ region p6 may be disposed in the second p-well PW2. As shown in FIG. 8, the sixth n+ region n6 may be connected to a seventh p+ region p7, and thus may be connected to the second trigger diode Dt2. The fifth p+ region p5, the seventh n+ region n7, the third n-well NW3 and the second p-well PW2 may be included in the second silicon controlled rectifier SCR2. As shown in FIG. 8, the fifth p+ region p5, which may be the anode of the second silicon controlled rectifier SCR2, may be connected to the pad P, and the seventh n+ region n7, which may be the cathode of the second silicon controlled rectifier SCR2, may be connected to the second node N2. The sixth p+ region p6 may be connected to the second node N2, and thus, a base of the second NPN bipolar transistor Qn2 (or a collector of the second PNP bipolar transistor Qp2) of the second silicon controlled rectifier SCR2 may be connected to the second node N2 through a resistor of the second p-well PW2, which may be the second resistor Rpw.

An eighth n+ region n8 and the seventh p+ region p7 may be disposed in the fourth n-well NW4. The eighth n+ region n8 may surround the second trigger diode Dt2 on the fourth n-well NW4. As shown in FIG. 8, the eighth n+ region n8 may be connected to the second node N2. The seventh p+ region p7 and the fourth n-well NW4 may be included in the second trigger diode Dt2. As shown in FIG. 8, the seventh p+ region p7 may be connected to the third n-well NW3 through the sixth n+ region n6, and thus may be connected to the base of the second PNP bipolar transistor Qp2 of the second silicon controlled rectifier SCR2.

Figure 9:
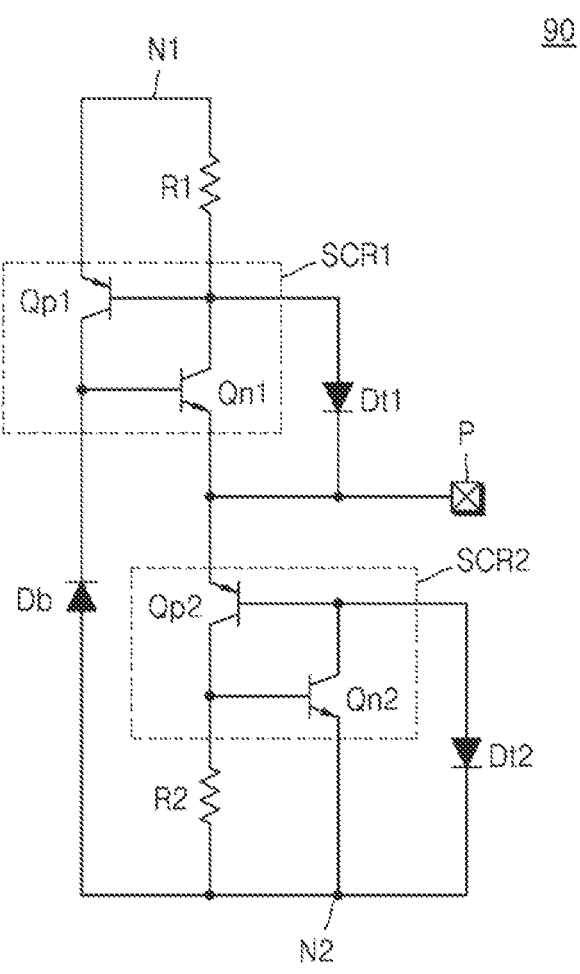
FIG. 9 is a circuit diagram of an IO clamp according to an embodiment.

FIG. 9 is a circuit diagram of an IO clamp 90 according to an embodiment. For example, the circuit diagram of FIG. 9 shows the IO clamp 90 for providing ESD protection, wherein, when ESD occurs in a first node N1, a second node N2, or a pad P, the IO clamp 90 may form discharge paths between the first node N1 and the pad P and between the second node N2 and the pad P. As shown in FIG. 9, the IO clamp 90 may include a first silicon controlled rectifier SCR1, a second silicon controlled rectifier SCR2, a first resistor R1, a second resistor R2, a first trigger diode Dt1, a second trigger diode Dt2, and a back diode Db. Compared to the IO clamp 70 of FIG. 7, each of the first resistor R1 and the second resistor R2 of the IO clamp 90 of FIG. 9 may additionally include at least one resistor disposed outside the elements included in the IO clamp 70. In some embodiments, the IO clamp 90 may include only one of the first resistor R1 and the second resistor R2. Hereinafter, descriptions of FIG. 9 which are redundant or duplicative of descriptions provided above may be omitted.

The first silicon controlled rectifier SCR1 may include a first PNP bipolar transistor Qp1 and a first NPN bipolar transistor Qn1. The first silicon controlled rectifier SCR1 may have an anode connected to the first node N1, a cathode connected to the pad P. and a gate connected to the back diode Db. The second silicon controlled rectifier SCR2 may include a second PNP bipolar transistor Qp2 and a second NPN bipolar transistor Qn2. The second silicon controlled rectifier SCR2 may have an anode connected to the pad P, a cathode connected to second node N2, and a gate connected to the second resistor R2.

The first trigger diode Dt1 may be forwardly connected from a base of the first PNP bipolar transistor Qp1 to the pad P. The second trigger diode Dt2 may be forwardly connected from a base of the second PNP bipolar transistor Qp2 to the second node N2. In some embodiments, the IO clamp 90 may further include at least one trigger diode connected in series to the first trigger diode Dt1, and may further include at least one trigger diode connected in series to the second trigger diode Dt2. The back diode Db may be forwardly connected from the second node N2 to the gate of the first silicon controlled rectifier SCR1.

The first resistor R1 may be connected to the first node N1 and the base of the first PNP bipolar transistor Qp1 (or a collector of the first NPN bipolar transistor Qn1). The second resistor R2 may be connected between a base of the second NPN bipolar transistor Qn2 (or a collector of the second PNP bipolar transistor Qp2) and the second node N2. In some embodiments, as described above with reference to FIG. 7, the first resistor R1 may include a well resistor, for example an n-well resistor, and the second resistor R2 may also include a well resistor, for example a p-well resistor.

The first resistor R1 and the second resistor R2 may be resistors which are disposed outside the other elements included in the IO clamp 90. For example, as described below with reference to FIG. 10, the IO clamp 90 may be an integrated circuit manufactured through a semiconductor process. A front-end-of-line (FEOL) process may include, for example, planarizing and cleaning a wafer, forming a trench, forming a well, forming a gate electrode, and forming a source region and a drain region. Through the FEOL process, individual elements, such as transistors, may be formed on a substrate. A back-end-of-line (BEOL) process may include performing silicidation of gate, source, and drain regions, adding a dielectric, performing planarization, forming a hole, adding a metal layer, forming a via, forming a passivation layer, and the like. Through the BEOL process, wires may be formed and individual elements may be connected to each other. In some embodiments, each of the first resistor R1 and the second resistor R2 may include a resistor disposed in a wiring layer during the BEOL process.

Figure 10:
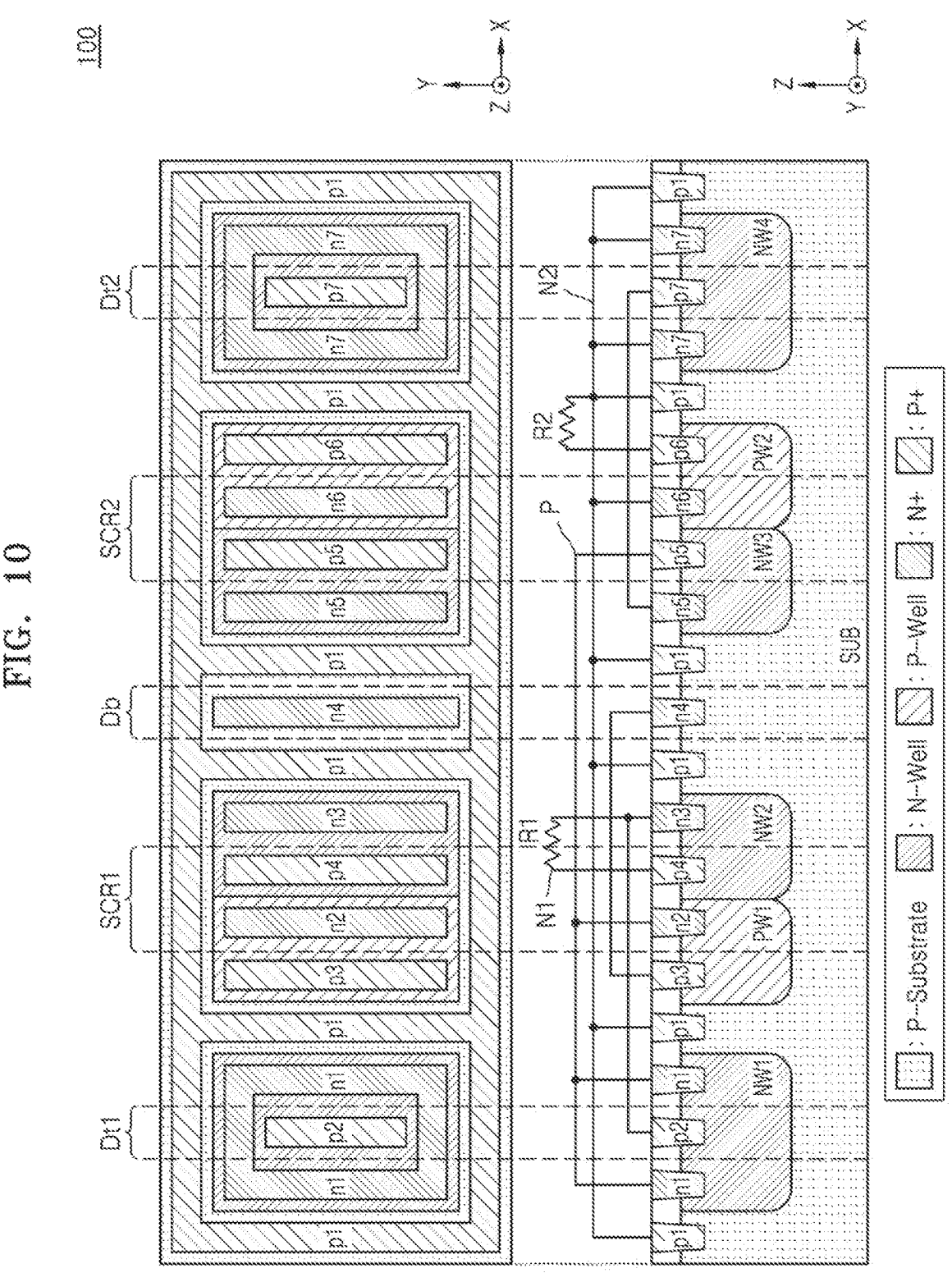
FIG. 10 is a diagram showing a layout of an IO clamp according to an embodiment.

FIG. 10 is a diagram showing a layout 100 of an IO clamp according to an embodiment. For example, FIG. 10 shows a plan view and a cross-sectional view of the layout 100 corresponding to the IO clamp 90 of FIG. 9. In FIG. 10, contacts and patterns for connecting p+ regions, n+ regions, and gates to each other are omitted for convenience of illustration. It should be noted that the IO clamp 90 of FIG. 9 is not limited to the layout 100 of FIG. 10. Hereinafter, FIG. 10 will be described with reference to FIG. 9.

Referring to FIG. 10, first to fourth n-wells NW1 to NW4, a first p-well PW1, and a second p-well PW2 may be disposed in a substrate SUB including p-type impurities. A first p+ region p1 may surround each of the first silicon controlled rectifier SCR1, the second silicon controlled rectifier SCR2, the first trigger diode Dt1, the second trigger diode Dt2, and the back diode Db on the substrate SUB. As shown in FIG. 10, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first trigger diode Dt1 on the first n-well NW1. As shown in FIG. 10, the first n+ region n1 may be connected to the pad P. The second p+ region p2 and the first n-well NW1 may be included in the first trigger diode Dt1. As shown in FIG. 10, the second p+ region p2 may be connected to the second n-well NW2 through a third n+ region n3, and thus may be connected to the base of the first PNP bipolar transistor Qp1 of the first silicon controlled rectifier SCR1.

In the substrate SUB, the first p-well PW1 and the second n-well NW2 may be consecutively disposed, and may abut each other. A third p+ region p3 and a second n+ region n2 may be disposed in the first p-well PW1, and a fourth p+ region p4 and the third n+ region n3 may be disposed in the second n-well NW2. As shown in FIG. 10, the third p+ region p3 may be connected to a fourth n+ region n4, and thus may be connected to the back diode Db. The second n+ region n2, the fourth p+ region p4, the first p-well PW1 and the second n-well NW2 may be included in the first silicon controlled rectifier SCR1. As shown in FIG. 10, the second n+ region n2, which may be the cathode of the first silicon controlled rectifier SCR1, may be connected to the pad P, and the fourth p+ region p4, which may be the anode of the first silicon controlled rectifier SCR1, may be connected to the first node N1. As shown in FIG. 10, the third n+ region n3 may be connected to the first node N1 through the first trigger diode Dt1 and the first resistor R1. Accordingly, the base of the first PNP bipolar transistor Qp1 (or the collector of the first NPN bipolar transistor Qn1) of the first silicon controlled rectifier SCR1 may be connected to the first node N1 through the first resistor R1.

The fourth n+ region n4 may be disposed between the first silicon controlled rectifier SCR1 and the second silicon controlled rectifier SCR2 in the substrate SUB. The fourth n+ region n4 and the substrate SUB, which includes a p-type dopant, may be included in the back diode Db. As shown in FIG. 10, the fourth n+ region n4 may be connected to the first p-well PW1 through the third p+ region p3, and thus may be connected to a base of the first NPN bipolar transistor Qn1 of the first silicon controlled rectifier SCR1. In some embodiments, an additional n-well may be formed between the second n-well NW2 and the third n-well NW3, and the back diode Db may include the additional n-well and a p+ region disposed on the additional n-well.

In the substrate SUB, the third n-well NW3 and the second p-well PW2 may be consecutively disposed, and may abut each other. A fifth n+ region n5 and a fifth p+ region p5 may be disposed in the third n-well NW3, and a sixth n+ region n6 and a sixth p+ region p6 may be disposed in the second p-well PW2. As shown in FIG. 10, the fifth n+ region n5 may be connected to a seventh p+ region p7, and thus may be connected to the second trigger diode Dt2. The fifth p+ region p5, the sixth n+ region n6, the third n-well NW3 and the second p-well PW2 may be included in the second silicon controlled rectifier SCR2. As shown in FIG. 10, the fifth p+ region p5, which may be the anode of the second silicon controlled rectifier SCR2, may be connected to the pad P, and the sixth n+ region n6, which may be the cathode of the second silicon controlled rectifier SCR2, may be connected to the second node N2. As shown in FIG. 10, the sixth p+ region p6 may be connected to the second node N2 through the second resistor R2. Accordingly, the base of the second NPN bipolar transistor Qn2 (or the collector of the second PNP bipolar transistor Qp2) of the second silicon controlled rectifier SCR2 may be connected to the second node N2 through the second resistor R2.

A seventh n+ region n7 and the seventh p+ region p7 may be disposed in the fourth n-well NW4. The seventh n+ region n7 may surround the second trigger diode Dt2 on the fourth n-well NW4. As shown in FIG. 10, the seventh n+ region n7 may be connected to the second node N2. The seventh p+ region p7 and the fourth n-well NW4 may be included in the second trigger diode Dt2. As shown in FIG. 10, the seventh p+ region p7 may be connected to the third n-well NW3 through the fifth n+ region n5, and thus may be connected to the base of the second PNP bipolar transistor Qp2 of the second silicon controlled rectifier SCR2.

Figure 11:
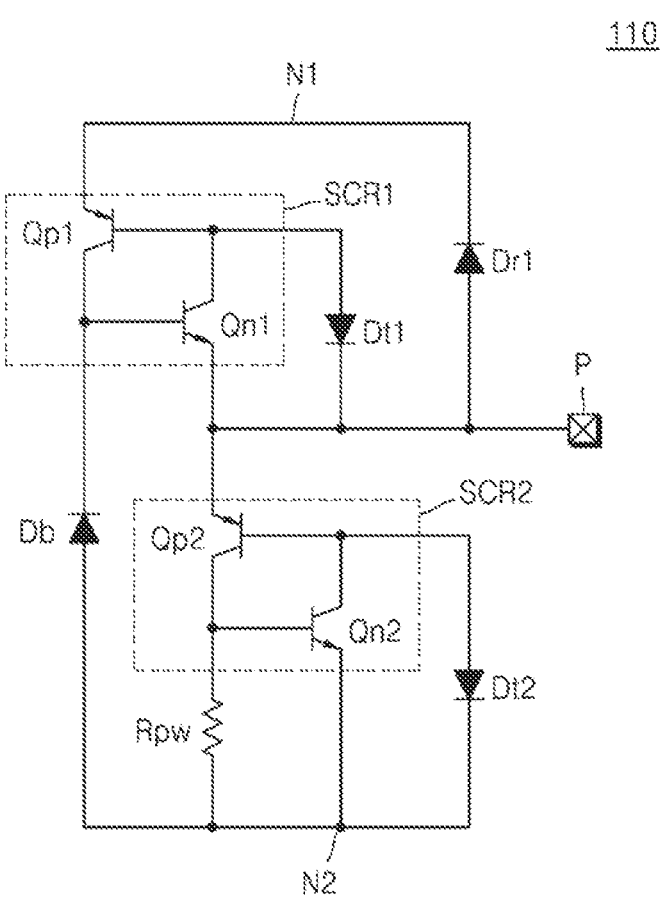
FIG. 11 is a circuit diagram of an IO clamp according to an embodiment.

FIG. 11 is a circuit diagram of an IO clamp 110 according to an embodiment. For example, the circuit diagram of FIG. 11 shows the IO clamp 110 for providing ESD protection, wherein, when ESD occurs in a first node N1, a second node N2, or a pad P, the IO clamp 110 may form discharge paths between the first node N1 and the pad P and between the second node N2 and the pad P. As shown in FIG. 11, the IO clamp 110 may include a first silicon controlled rectifier SCR1, a second silicon controlled rectifier SCR2, a resistor Rpw, a first trigger diode Dt1, a second trigger diode Dt2, a back diode Db, and a first reverse diode Dr1. Compared to the IO clamp 40 of FIG. 4, the IO clamp 110 of FIG. 11 may further include the first reverse diode Dr1. Hereinafter, descriptions of FIG. 11 which are redundant or duplicative of descriptions provided above may be omitted.

The first silicon controlled rectifier SCR1 may include a first PNP bipolar transistor Qp1 and a first NPN bipolar transistor Qn1. The first silicon controlled rectifier SCR1 may have an anode connected to the first node N1, a cathode connected to the pad P, and a gate connected to the back diode Db. The second silicon controlled rectifier SCR2 may include a second PNP bipolar transistor Qp2 and a second NPN bipolar transistor Qn2. The second silicon controlled rectifier SCR2 may have an anode connected to the pad P, a cathode connected to second node N2, and a gate connected to the resistor Rpw.

The first trigger diode Dt1 may be forwardly connected from a base of the first PNP bipolar transistor Qp1 to the pad P. The second trigger diode Dt2 may be forwardly connected from a base of the second PNP bipolar transistor Qp2 to the second node N2. In some embodiments, the IO clamp 110 may further include at least one trigger diode connected in series to the first trigger diode Dt1, and may further include at least one trigger diode connected in series to the second trigger diode Dt2. The back diode Db may be forwardly connected from the second node N2 to the gate of the first silicon controlled rectifier SCR1.

The first reverse diode Dr1 may have a cathode connected to the first node N1 and an anode connected to the pad P. For example, the first reverse diode Dr1 may be forwardly connected from the pad P to the first node N1. When a high voltage is generated in the pad P due to ESD, while a discharge path may be formed between the pad P and the second node N2 by the second silicon controlled rectifier SCR2, as described above, a discharge path may be formed from the pad P to the first node N1 through the first reverse diode Dr1. A current passing through the first reverse diode Dr1 may flow to the second node N2 through a power clamp (e.g., power clamp 17 in FIG. 1) connected between the first node N1 and the second node N2. Accordingly, a more enhanced discharge path may be provided.

Figure 12:
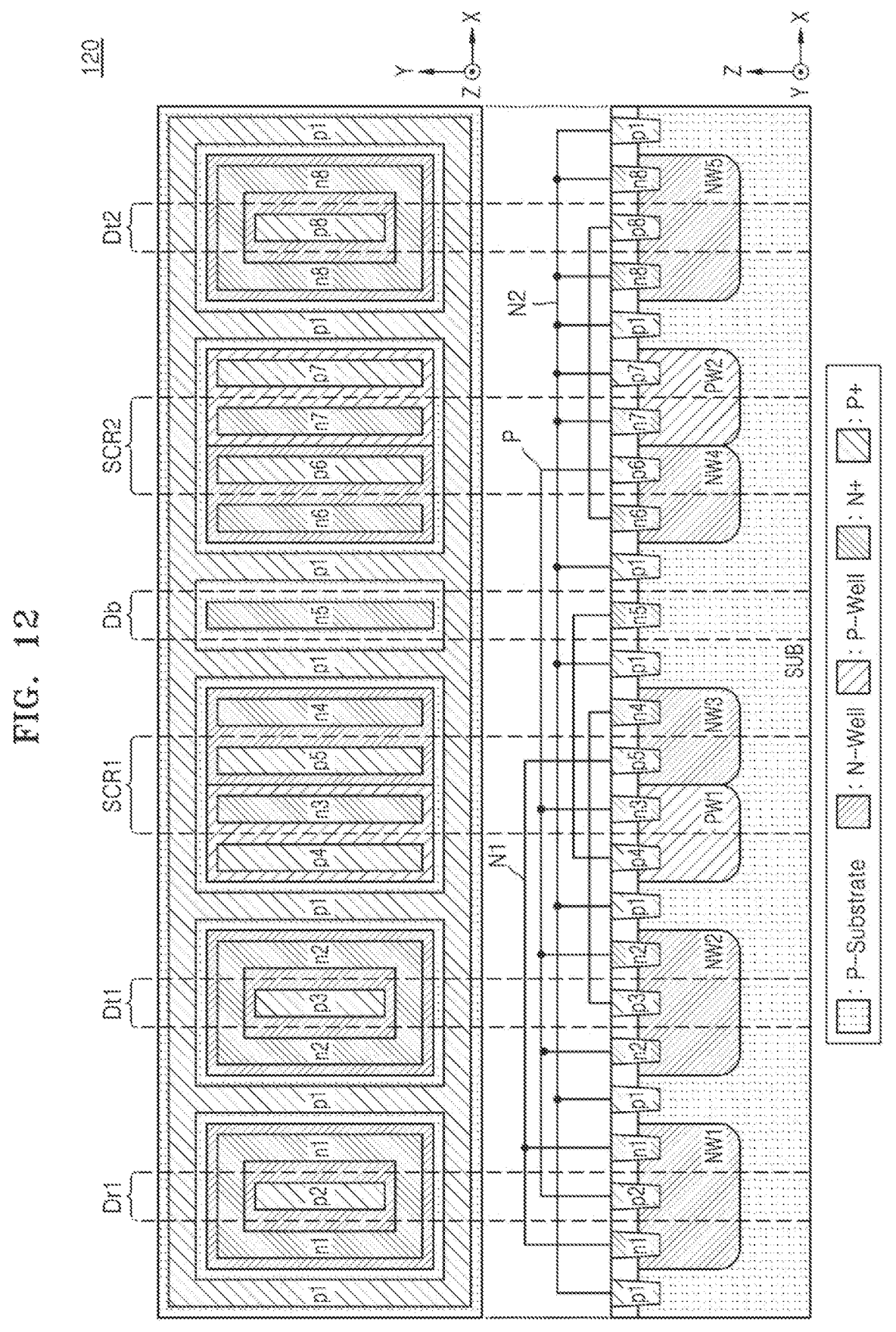

FIG. 12 is a diagram showing a layout 120 of an IO clamp according to an embodiment. For example, FIG. 12 shows a plan view and a cross-sectional view of the layout 120 corresponding to the IO clamp 110 of FIG. 11. In FIG. 12, contacts and patterns for connecting p+ regions, n+ regions, and gates to each other are omitted for convenience of illustration. It should be noted that the IO clamp 110 of FIG. 11 is not limited to the layout 120 of FIG. 12. Hereinafter, FIG. 12 will be described with reference to FIG. 11.

Referring to FIG. 12, first to fifth n-wells NW1 to NW5, a first p-well PW1, and a second p-well PW2 may be disposed in a substrate SUB including p-type impurities. A first p+ region p1 may surround each of the first silicon controlled rectifier SCR1, the second silicon controlled rectifier SCR2, the first trigger diode Dt1, the second trigger diode Dt2, the back diode Db, and the first reverse diode Dr1 on the substrate SUB. As shown in FIG. 12, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first reverse diode Dr1 on the first n-well NW1. As shown in FIG. 12, the first n+ region n1 may be connected to the first node N1. The second p+ region p2 and the first n-well NW1 may be included in the first reverse diode Dr1, and the second p+ region p2 may be connected to the pad P, as shown in FIG. 12.

A second n+ region n2 and a third p+ region p3 may be disposed in the second n-well NW2. The second n+ region n2 may surround the first trigger diode Dt1 on the second n-well NW2. As shown in FIG. 12, the second n+ region n2 may be connected to the pad P. The third p+ region p3 and the second n-well NW2 may be included in the first trigger diode Dt1. As shown in FIG. 12, the third p+ region p3 may be connected to the third n-well NW3 through a fourth n+ region n4, and thus may be connected to the base of the first PNP bipolar transistor Qp1 of the first silicon controlled rectifier SCR1.

In the substrate SUB, the first p-well PW1 and the third n-well NW3 may be consecutively disposed, and may abut each other. A fourth p+ region p4 and a third n+ region n3 may be disposed in the first p-well PW1, and a fifth p+ region p5 and the fourth n+ region n4 may be disposed in the third n-well NW3. As shown in FIG. 12, the fourth p+ region p4 may be connected to a fifth n+ region n5, and thus may be connected to the back diode Db. The third n+ region n3, the fifth p+ region p5, the first p-well PW1 and the third n-well NW3 may be included in the first silicon controlled rectifier SCR1. As shown in FIG. 12, the third n+ region n3, which may be the cathode of the first silicon controlled rectifier SCR1, may be connected to the pad P, and the fifth p+ region p5, which may be the anode of the first silicon controlled rectifier SCR1, may be connected to the first node N1. As described above, the fourth n+ region n4 may be connected to the first trigger diode Dt1.

The fifth n+ region n5 may be disposed between the first silicon controlled rectifier SCR1 and the second silicon controlled rectifier SCR2 in the substrate SUB. The fifth n+ region n5 and the substrate SUB, which includes a p-type dopant, may be included in the back diode Db. As shown in FIG. 12, the fifth n+ region n5 may be connected to the first p-well PW1 through the fourth p+ region p4, and thus may be connected to a base of the first NPN bipolar transistor Qn1 of the first silicon controlled rectifier SCR1. In some embodiments, an additional n-well may be formed between the third n-well NW3 and the fourth n-well NW4, and the back diode Db may include the additional n-well and a p+ region disposed on the additional n-well.

In the substrate SUB, the fourth n-well NW4 and the second p-well PW2 may be consecutively disposed, and may abut each other. A sixth n+ region n6 and a sixth p+ region p6 may be disposed in the fourth n-well NW4, and a seventh n+ region n7 and a seventh p+ region p7 may be disposed in the second p-well PW2. As shown in FIG. 12, the sixth n+ region n6 may be connected to an eighth p+ region p8, and thus may be connected to the second trigger diode Dt2. The sixth p+ region p6, the seventh n+ region n7, the fourth n-well NW4 and the second p-well PW2 may be included in the second silicon controlled rectifier SCR2. As shown in FIG. 12, the sixth p+ region p6, which may be the anode of the second silicon controlled rectifier SCR2, may be connected to the pad P, and the seventh n+ region n7, which may be the cathode of the second silicon controlled rectifier SCR2, may be connected to the second node N2. The seventh p+ region p7 may be connected to the second node N2, and thus, a base of the second NPN bipolar transistor Qn2 (or a collector of the second PNP bipolar transistor Qp2) of the second silicon controlled rectifier SCR2 may be connected to the second node N2 through a resistor of the second p-well PW2, which may be the resistor Rpw.

An eighth n+ region n8 and the eighth p+ region p8 may be disposed in the fifth n-well NW5. The eighth n+ region n8 may surround the second trigger diode Dt2 on the fourth n-well NW4. As shown in FIG. 12, the eighth n+ region n8 may be connected to the second node N2. The eighth p+ region p8 and the fifth n-well NW5 may be included in the second trigger diode Dt2. As shown in FIG. 12, the eighth p+ region p8 may be connected to the fourth n-well NW4 through the sixth n+ region n6, and thus may be connected to the base of the second PNP bipolar transistor Qp2 of the second silicon controlled rectifier SCR2.

Figure 13:
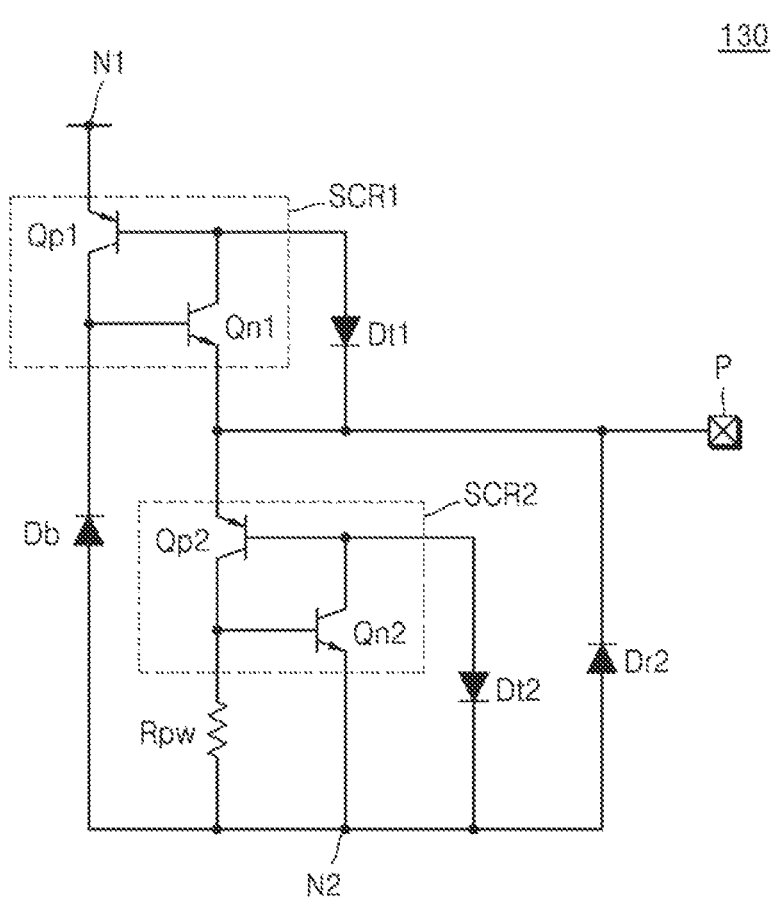
FIG. 13 is a circuit diagram of an IO clamp according to an embodiment.

FIG. 13 is a circuit diagram of an IO clamp 130 according to an embodiment. For example, the circuit diagram of FIG. 13 shows the IO clamp 130 for providing ESD protection, wherein, when ESD occurs in a first node N1, a second node N2, or a pad P, the IO clamp 130 may form discharge paths between the first node N1 and the pad P and between the second node N2 and the pad P. As shown in FIG. 13, the IO clamp 130 may include a first silicon controlled rectifier SCR1, a second silicon controlled rectifier SCR2, a resistor Rpw, a first trigger diode Dt1, a second trigger diode Dt2, a back diode Db, and a second reverse diode Dr2. Compared to the IO clamp 40 of FIG. 4, the IO clamp 130 of FIG. 13 may further include the second reverse diode Dr2. In some embodiments, the IO clamp 130 may also include the first reverse diode Dr1 described above with reference to FIG.

11. Hereinafter, descriptions of FIG. 13 which are redundant or duplicative of descriptions provided above may be omitted.

The first silicon controlled rectifier SCR1 may include a first PNP bipolar transistor Qp1 and a first NPN bipolar transistor Qn1. The first silicon controlled rectifier SCR1 may include an anode connected to the first node N1, a cathode connected to the pad P, and a gate connected to the back diode Db. The second silicon controlled rectifier SCR2 may include a second PNP bipolar transistor Qp2 and a second NPN bipolar transistor Qn2. The second silicon controlled rectifier SCR2 may have an anode connected to pad P, a cathode connected to second node N2, and a gate connected to the resistor Rpw.

The first trigger diode Dt1 may be forwardly connected from a base of the first PNP bipolar transistor Qp1 to the pad P. The second trigger diode Dt2 may be forwardly connected from a base of the second PNP bipolar transistor Qp2 to the second node N2. In some embodiments, the IO clamp 130 may further include at least one trigger diode connected in series to the first trigger diode Dt1, and may further include at least one trigger diode connected in series to the second trigger diode Dt2. The back diode Db may be forwardly connected from the second node N2 to the gate of the first silicon controlled rectifier SCR1.

The second reverse diode Dr2 may have a cathode connected to the pad P and an anode connected to the second node N2. For example, the second reverse diode Dr2 may be forwardly connected from the second node N2 to the pad P. When a low voltage is generated in the pad P due to ESD, while a discharge path may be formed between the pad P and the first node N1 by the first silicon controlled rectifier SCR1, as described above, a discharge path may be formed from the second node N2 to the pad P through the second reverse diode Dr2. A current supplied through the second reverse diode Dr2 may be provided from the first node N1 through a power clamp (e.g., power clamp 17 in FIG. 1) connected between the first node N1 and the second node N2. Accordingly, a more enhanced discharge path may be provided.

Figure 14:
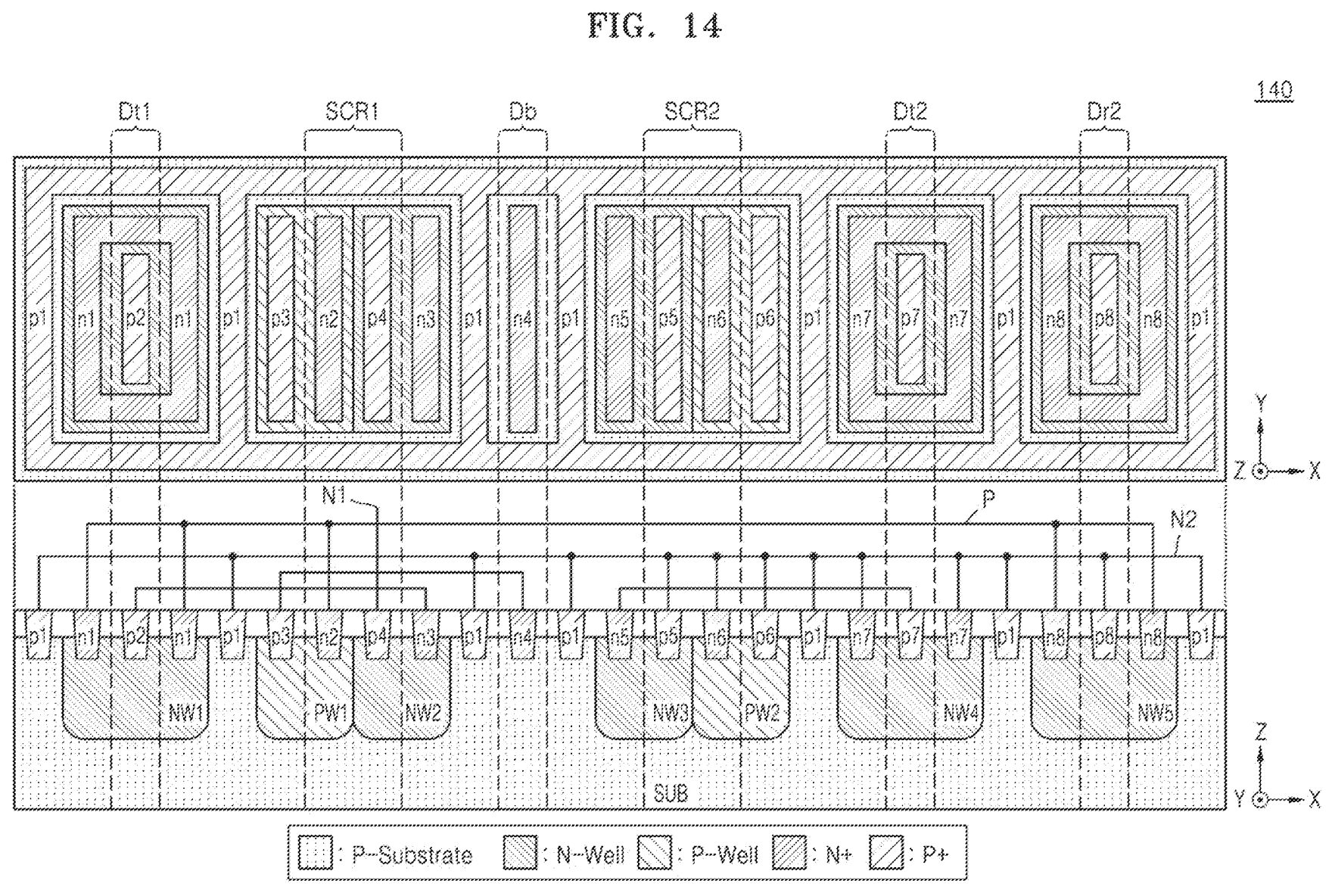

FIG. 14 is a diagram showing a layout 140 of an IO clamp according to an embodiment. For example, FIG. 14 shows a plan view and a cross-sectional view of the layout 140 corresponding to the IO clamp 130 of FIG. 13. In FIG. 14, contacts and patterns for connecting p+ regions, n+ regions, and gates to each other are omitted for convenience of illustration. It should be noted that the IO clamp 130 of FIG. 13 is not limited to the layout 140 of FIG. 14. Hereinafter, FIG. 14 will be described with reference to FIG. 13.

Referring to FIG. 14, first to fifth n-wells NW1 to NW5, a first p-well PW1, and a second p-well PW2 may be disposed in a substrate SUB including p-type impurities. A first p+ region p1 may surround each of the first silicon controlled rectifier SCR1, the second silicon controlled rectifier SCR2, the first trigger diode Dt1, the second trigger diode Dt2, the back diode Db, and the second reverse diode Dr2 on the substrate SUB. As shown in FIG. 14, the first p+ region p1 may be connected to the second node N2, and thus, a negative supply voltage (e.g., VSS in FIG. 1) may be applied to the substrate SUB.

A first n+ region n1 and a second p+ region p2 may be disposed in the first n-well NW1. The first n+ region n1 may surround the first trigger diode Dt1 on the first n-well NW1. As shown in FIG. 14, the first n+ region n1 may be connected to the pad P. The second p+ region p2 and the first n-well NW1 may be included in the first trigger diode Dt1. As shown in FIG. 14, the second p+ region p2 may be connected to the second n-well NW2 through a third n+ region n3, and thus may be connected to the base of the first PNP bipolar transistor Qp1 of the first silicon controlled rectifier SCR1.

In the substrate SUB, the first p-well PW1 and the second n-well NW2 may be consecutively disposed, and may abut each other. A third p+ region p3 and a second n+ region n2 may be disposed in the first p-well PW1, and a fourth p+ region p4 and the third n+ region n3 may be disposed in the second n-well NW2. As shown in FIG. 14, the third p+ region p3 may be connected to a fourth n+ region n4, and thus may be connected to the back diode Db. The second n+ region n2, the fourth p+ region p4, the first p-well PW1 and the second n-well NW2 may be included in the first silicon controlled rectifier SCR1. As shown in FIG. 14, the second n+ region n2, which may be the cathode of the first silicon controlled rectifier SCR1, may be connected to the pad P, and the fourth p+ region p4, which may be the anode of the first silicon controlled rectifier SCR1, may be connected to the first node N1. As described above, the third n+ region n3 may be connected to the first trigger diode Dt1.

The fourth n+ region n4 may be disposed between the first silicon controlled rectifier SCR1 and the second silicon controlled rectifier SCR2 in the substrate SUB. The fourth n+ region n4 and the substrate SUB, which includes a p-type dopant, may be included in the back diode Db. As shown in FIG. 14, the fourth n+ region n4 may be connected to the first p-well PW1 through the third p+ region p3, and thus may be connected to a base of the first NPN bipolar transistor Qn1 of the first silicon controlled rectifier SCR1. In some embodiments, an additional n-well may be formed between the second n-well NW2 and the third n-well NW3, and the back diode Db may include the additional n-well and a p+ region disposed on the additional n-well.

In the substrate SUB, the third n-well NW3 and the second p-well PW2 may be consecutively disposed, and may abut each other. A fifth n+ region n5 and a fifth p+ region p5 may be disposed in the third n-well NW3, and a sixth n+ region n6 and a sixth p+ region p6 may be disposed in the second p-well PW2. As shown in FIG. 14, the fifth n+ region n5 may be connected to a seventh p+ region p7, and thus may be connected to the second trigger diode Dt2. The fifth p+ region p5, the sixth n+ region n6, the third n-well NW3 and the second p-well PW2 may be included in the second silicon controlled rectifier SCR2. As shown in FIG. 14, the fifth p+ region p5, which may be the anode of the second silicon controlled rectifier SCR2, may be connected to the pad P, and the sixth n+ region n6, which may be the cathode of the second silicon controlled rectifier SCR2, may be connected to the second node N2. The sixth p+ region p6 may be connected to the second node N2, and thus, a base of the second NPN bipolar transistor Qn2 (or a collector of the second PNP bipolar transistor Qp2) of the second silicon controlled rectifier SCR2 may be connected to the second node N2 through a resistor of the second p-well PW2, which may be the resistor Rpw.

A seventh n+ region n7 and the seventh p+ region p7 may be disposed in the fourth n-well NW4. The seventh n+ region n7 may surround the second trigger diode Dt2 on the fourth n-well NW4. As shown in FIG. 14, the seventh n+ region n7 may be connected to the second node N2. The seventh p+ region p7 and the fourth n-well NW4 may be included in the second trigger diode Dt2. As shown in FIG. 14, the seventh p+ region p7 may be connected to the third n-well NW3 through the fifth n+ region n5, and thus may be connected to the base of the second PNP bipolar transistor Qp2 of the second silicon controlled rectifier SCR2.

An eighth n+ region n8 and an eighth p+ region p8 may be disposed in the fifth n-well NW5. The eighth n+ region n8 may surround the second reverse diode Dr2 on the fifth n-well NW5. As shown in FIG. 14, the eighth n+ region n8 may be connected to the pad P. The eighth p+ region p8 and the fifth n-well NW5 may be included in the second reverse diode Dr2, and the eighth p+ region p8 may be connected to the second node N2, as shown in FIG. 14.

While embodiments have been particularly shown and described above, it will be understood that various changes in form and details may be made therein without departing from the spirit and scope of the following claims.

What is claimed is:

1. A device comprising:
a first silicon controlled rectifier comprising a first anode connected to a first node, a first cathode connected to a pad, and a first gate;
a second silicon controlled rectifier comprising a second anode connected to the pad, a second cathode connected to a second node, and a second gate; and
a back diode forwardly connected from the second node to the first gate,
wherein the back diode is directly connected to the first gate.

2. The device of claim 1, wherein the device comprises:
a p-type substrate in which the first silicon controlled rectifier, the second silicon controlled rectifier, and the back diode are disposed; and
wherein the back diode comprises an n+ region connected to the p-type substrate.

3. The device of claim 1, wherein the first silicon controlled rectifier comprises:
a first PNP bipolar transistor, wherein an emitter of the first PNP bipolar transistor is connected to the first anode, and a collector of the first PNP bipolar transistor is connected to the first gate; and
a first NPN bipolar transistor, wherein a collector of the first NPN bipolar transistor is connected to a base of the first PNP bipolar transistor, an emitter of the first NPN bipolar transistor is connected to the first cathode, and a base of the first NPN bipolar transistor is connected to the first gate, and
wherein the device further comprises at least one first trigger diode forwardly connected from the base of the first PNP bipolar transistor to the pad.

4. The device of claim 3, further comprising a first resistor connected between the first node and the base of the first PNP bipolar transistor.

5. The device of claim 4, wherein the first resistor comprises an n-well resistor.

6. The device of claim 4, wherein the first resistor comprises a resistor disposed in a wiring layer.

7. The device of claim 1, wherein the second silicon controlled rectifier comprises:
a second PNP bipolar transistor, wherein an emitter of the second PNP bipolar transistor is connected to the pad, and a collector of the second PNP bipolar transistor is connected to the second node; and
a second NPN bipolar transistor, wherein a collector of the second NPN bipolar transistor is connected to a base of the second PNP bipolar transistor, an emitter of the second NPN bipolar transistor is connected to the second cathode, and a base of the second NPN bipolar transistor is connected to the second gate, and
wherein the device further comprises at least one second trigger diode forwardly connected from the base of the second PNP bipolar transistor to the second node.

8. The device of claim 1, further comprising a second resistor connected between the second gate of the second silicon controlled rectifier and the second node.

9. The device of claim 8, wherein the second resistor comprises a p-well resistor.

10. The device of claim 8, wherein the second resistor comprises a resistor disposed in a wiring layer.

11. The device of claim 1, further comprising a first reverse diode forwardly connected from the pad to the first node.

12. The device of claim 1, further comprising a second reverse diode forwardly connected from the second node to the pad.

13. The device of claim 1, wherein the first node is configured to receive a positive supply voltage, and wherein the second node is configured to receive a negative supply voltage.

14. A device comprising:

a first silicon controlled rectifier comprising a first p-well and a first n-well consecutively disposed in a substrate, a first n+ region disposed in the first p-well, and a first p+ region disposed in the first n-well, wherein the first p+ region is electrically connected to a first node;

a second silicon controlled rectifier comprising a second n-well and a second p-well consecutively disposed in the substrate, a second p+ region disposed in the second n-well, and a second n+ region disposed in the second p-well, wherein the second n+ region is electrically connected to a second node; and a back diode comprising a third n+ region disposed in the substrate between the first silicon controlled rectifier and the second silicon controlled rectifier, wherein the third n+ region is electrically connected to the first p-well, wherein the first n+ region and the second p+ region are electrically connected to a pad.

15. The device of claim 14, wherein the first node is configured to receive a positive supply voltage, and wherein the second node is configured to receive a negative supply voltage.

16. The device of claim 14, further comprising a first trigger diode comprising a third n-well and a third p+ region disposed in the third n-well, wherein the third n-well is electrically connected to the pad, and wherein the third p+ region is electrically connected to the first n-well.

17. The device of claim 14, further comprising a second trigger diode comprising a fourth n-well and a fourth p+ region disposed in the fourth n-well, wherein the fourth n-well is electrically connected to the second node, and wherein the fourth p+ region is electrically connected to the second n-well.

18. The device of claim 14, wherein the first p-well and the first n-well are disposed in a first deep n-well in the substrate, and wherein the second n-well and the second p-well are disposed in a second deep n-well in the substrate.

19. A device comprising:

a first PNP bipolar transistor and a first NPN bipolar transistor, wherein a base of the first NPN bipolar transistor is connected to a collector of the first PNP bipolar transistor, and wherein a collector of the first NPN bipolar transistor is connected to a base of the first PNP bipolar transistor; and a second PNP bipolar transistor and a second NPN bipolar transistor, wherein a base of the second NPN bipolar transistor is connected to a collector of the second PNP bipolar transistor, and wherein a collector of the second NPN bipolar transistor is connected to a base of the second PNP bipolar transistor, wherein an emitter of the first PNP bipolar transistor is connected to a first node, wherein an emitter of the first NPN bipolar transistor and an emitter of the second PNP bipolar transistor are connected to a pad, wherein an emitter of the second NPN bipolar transistor is connected to a second node, and wherein the device further comprises a back diode forwardly connected from the second node to the base of the first NPN bipolar transistor, wherein the back diode is directly connected to the base of the first NPN bipolar transistor.

20. The device of claim 19, further comprising:

at least one first trigger diode forwardly connected from the base of the first PNP bipolar transistor to the pad; and at least one second trigger diode forwardly connected from the base of the second PNP bipolar transistor to the second node.

* * * * *